United States Patent
Mizuno et al.

(10) Patent No.: US 7,906,824 B2
(45) Date of Patent: Mar. 15, 2011

(54) SOLID STATE IMAGING DEVICE AND METHOD OF MANUFACTURING THE SAME

(75) Inventors: Ikuo Mizuno, Kyoto (JP); Tohru Yamada, Tokyo (JP)

(73) Assignee: Panasonic Corporation, Osaka (JP)

( * ) Notice: Subject to any disclaimer, the term of this patent is extended or adjusted under 35 U.S.C. 154(b) by 195 days.

(21) Appl. No.: 12/416,506

(22) Filed: Apr. 1, 2009

(65) Prior Publication Data

US 2009/0250728 A1    Oct. 8, 2009

(30) Foreign Application Priority Data

Apr. 2, 2008 (JP) ................. 2008-096360

(51) Int. Cl.
  *H01L 27/14* (2006.01)
(52) U.S. Cl. ........ 257/431; 257/291; 257/294; 257/432; 257/435; 257/443; 438/48; 438/57; 438/60; 438/70
(58) Field of Classification Search .............. None
See application file for complete search history.

(56) References Cited

U.S. PATENT DOCUMENTS

| | | | |
|---|---|---|---|
| 5,250,825 A | 10/1993 | Negishi et al. | |
| 7,102,185 B2 | 9/2006 | Nichols et al. | |
| 2006/0022235 A1* | 2/2006 | Kanbe | 257/294 |
| 2006/0138481 A1* | 6/2006 | Suzuki | 257/291 |

FOREIGN PATENT DOCUMENTS

| | | |
|---|---|---|
| JP | 4-279059 A | 10/1992 |
| JP | 2006-041369 A | 2/2006 |

* cited by examiner

*Primary Examiner* — N Drew Richards
*Assistant Examiner* — Kyoung Lee
(74) *Attorney, Agent, or Firm* — Hamre, Schumann, Mueller & Larson, P.C.

(57) ABSTRACT

A solid state imaging device has a plurality of photodetector parts 11 arranged in matrix, a plurality of vertical charge transfer electrodes 13 that read out signal charge from the photodetector parts and transfer the signal charge in the vertical direction, and a first light-shielding film 5 that shields the plural vertical charge transfer parts from incident light. Each of the vertical charge transfer electrodes includes: a transfer channel 12 provided along the vertical array of the plural photodetector parts, a plurality of first transfer electrodes 3a that are formed on the transfer channel so as to traverse the transfer channel and that is coupled in the horizontal direction in spacing between the photodetector parts; and second transfer electrodes 3b provided on the transfer channel and arranged between the first transfer electrodes. The first light-shielding film is formed continuously in the horizontal direction and has openings formed on the photodetector parts. Isolation regions having electroconductivity are formed between the photodetector parts and connected electrically to the second transfer electrode. Thereby, a shunt wiring structure capable of a high-speed transfer at a high sensitivity and with reduced smearing is obtained.

10 Claims, 24 Drawing Sheets

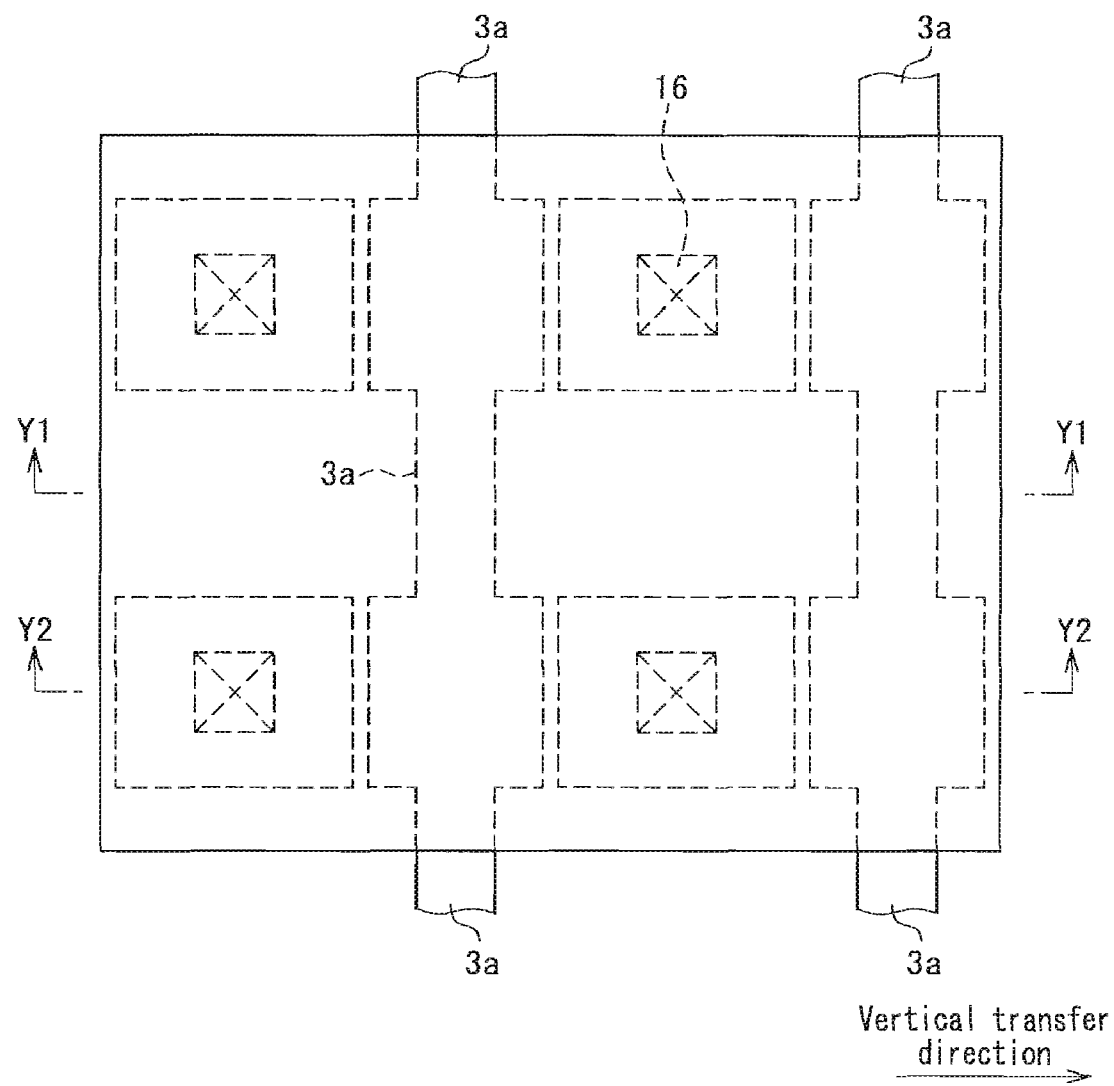
F I G. 5A

SOLID STATE IMAGING DEVICE AND METHOD OF MANUFACTURING THE SAME

BACKGROUND OF THE INVENTION

1. Field of the Invention

The present invention relates to a solid state imaging device having a configuration for transferring a signal charge read out from photodetector parts arranged in matrix, through vertical charge transfer parts. The present invention relates also to a method of manufacturing the solid state imaging device.

2. Description of Related Art

Solid state imaging devices represented by a CCD (charge coupled device) type solid state imaging device have been used widely as imaging elements for imaging apparatuses such as digital still cameras and digital video cameras, and the demands have been increased even more. In addition, due to the demands for coping with moving video pictures of high-definition TV in an imaging device accompanying a trend for the high-definition TV, enhancement in the speed of the transfer frequency has been required for such a solid state imaging device.

As a technique for enhancing the speed of the transfer frequency, namely, a technique for allowing a high-speed transfer, a technique of connecting a shunt wiring and an electrode via a light-shielding film extending in the vertical direction is known (for example, see JP H04-279059 A).

However, in a case of a vertical shunt wiring as shown in JP H04-279059 A, voltages of the same level will not be applied simultaneously to all of the plural light-shielding films connected to the shunt wiring, but the levels of the voltages to be applied vary between the adjacent light-shielding films. Moreover, since the light-shielding films are provided for the respective pixel arrays aligned in the vertical direction, the levels of voltages applied to the portion from the light-shielding films to the interface of the semiconductor substrate at the surface layer side vary between adjacent pixel arrays. As a result, in the solid state imaging device disclosed in JP H04-279059 A, the quantities of electric charge captured by the interface state of the semiconductor substrate and lost at the time of reading out from the photodetector part to the vertical charge transfer part vary from each other between adjacent pixels. This will cause output nonuniformity for the solid state imaging device.

For solving the above-mentioned problems, JP 2006-41369 A discloses a technique of forming a shunt wiring in the horizontal direction.

A solid state imaging device disclosed in JP 2006-41369 A will be described with reference to FIG. 13. In this solid state imaging device, a plurality of photodetector parts 101 are arranged in the horizontal and vertical directions, and transfer channels 102 extending in the vertical direction are arranged between the photodetector parts 101. First transfer electrodes 103a are arranged on the transfer channels 102 and coupled to each other in the horizontal direction in the spacing between the photodetector parts 101. Furthermore, on the transfer channels 102, second transfer electrodes 103b are arranged in the same layer as the first transfer electrodes 103a.

On each of the first transfer electrodes 103a, shunt wirings 104a and 104b extending in the horizontal direction and corresponding in number to the transfer electrodes are provided. The shunt wirings 104a, 104b have resistances lower than those of the first transfer electrodes 103a and the second transfer electrodes 103b. The shunt wirings 104a and 104b are connected respectively via connection parts 105 to the first transfer electrodes 103a and the second transfer electrodes 103b on the each of the transfer channels 102.

In a case of configuring a pixel of about 2 μm×2 μm, the width W1 of the first transfer electrode 103a is about 0.45 μm at the portion in the spacing between adjacent photodetector parts 101. The number of the shunt wirings 104a and 104b corresponds to the number of the transfer electrodes arranged for one photodetector part 101, and the number is two in this example. The width W2 of the two low-resistance shunt wirings 104a and 104b is 0.12 μm for example, and the width W3 of the space between the two shunt wirings 104a and 104b is 0.16 μm for example.

In the above solid state imaging device, since the shunt electrodes are not connected electrically to the light-shielding film, the level of voltage applied to the region from the light-shielding film to the interface at the surface of the semiconductor substrate are equal among the respective pixel arrays, and output nonuniformity will not occur.

However, when the technique disclosed in JP 2006-41369 A is applied, the wiring resistance will be increased due to the narrow width effect, because the width W2 of the shunt wirings 104a and 104b is as narrow as about 0.12 μm. This will result in a problem that the speed of transfer frequency cannot be enhanced sufficiently even by using low-resistance shunt wirings.

On the other hand, when the width of the shunt wirings 104 and 104b is increased to a degree not causing a narrow width effect (for example, 0.3 em), the width W1 of the first transfer electrode 103a also should be increased (for example, 0.8 μm). This will result in another problem that the opening width is decreased and the smear property and the sensitivity deteriorate.

SUMMARY OF THE INVENTION

Therefore, with the foregoing in mind, it is an object of the present invention to provide a solid state imaging device that has a shunt wiring structure that solves the above-mentioned problem and that can perform a high-speed transfer at a high sensitivity and with reduced smearing, and to provide a method of manufacturing the solid state imaging device.

A solid state imaging device according to the present invention includes: a plurality of photodetector parts that are arranged in matrix on a semiconductor substrate and that convert incident light into signal charge, a plurality of vertical charge transfer parts that read out the signal charge from the photodetector parts and transfer the signal charge in the vertical direction, and a first light-shielding film that shields the plural vertical charge transfer parts from the incident light. Each of the plural vertical charge transfer parts comprises: a transfer channel provided on the semiconductor substrate along the vertical array of the plural photodetector parts, a plurality of first transfer electrodes that are provided on the transfer channel so as to traverse the transfer channel and that are coupled to each other in the horizontal direction in spacing between the photodetector parts, and a second transfer electrode that is provided at least on the transfer channel and arranged between the first transfer electrodes.

For solving the above-described problems, the first light-shielding films are formed continuously in the horizontal direction, with openings on the photodetector parts and isolation regions formed between the photodetector parts so as to extend in the horizontal direction. The first light-shielding films have electroconductivity, and are connected electrically to the second transfer electrode.

According to the thus configured solid state imaging device of the present invention, a voltage is fed to the second transfer electrode from the light-shielding film having isolation regions extending in the horizontal direction. Namely, as the light-shielding film is used as a shunt wiring, the wiring width can be increased sufficiently. Thereby, a high-speed transfer frequency can be obtained.

Furthermore, since there is no necessity to dispose a plurality of wirings on the first transfer electrodes, the width of the first transfer electrodes can be decreased at portions between the photodetector parts. Thereby, the opening width can be increased and a high sensitivity can be achieved.

Further, the light-shielding film isolated horizontally and the second transfer electrodes are connected electrically, and they have the same potential constantly. Thereby, at any time reading out a charge from the photodetector parts to the vertical transfer parts, readout pulses are applied also to the light-shielding film. Thus the width in the vertical transfer direction of the second transfer electrodes can be decreased in comparison with a case where the readout pulse is not applied to the light-shielding film. Therefore, the opening width can be increased, the sensitivity can be improved and smearing can be reduced.

Furthermore, a method of manufacturing a solid state imaging device according to the present invention is a method of manufacturing a solid state imaging device comprising: a plurality of photodetector parts that are arranged in a matrix and that convert incident light into signal charge, a plurality of vertical charge transfer parts that read out the signal charge from the photodetector parts and transfer the signal charge in the vertical direction, and a light-shielding film that shields the plural vertical charge transfer parts from the incident light.

For solving the above-described problems, the method includes steps of (a) forming on a semiconductor substrate the plural photodetector parts and transfer channels each arranged along the vertical array of the plural photodetector parts; (b) forming the plural vertical charge transfer parts by providing on the transfer channel a plurality of first transfer electrodes that traverse the transfer channel and are coupled in the horizontal direction in spacing between the photodetector parts, and second transfer electrodes that are provided at least on the transfer channel and between the first transfer electrodes; (c) forming a first interlayer insulating film that covers the plural transfer electrodes; (d) forming on the first interlayer insulating film an electrically conductive film that covers the first interlayer insulating film and that is connected electrically to the second transfer electrodes; and (e) forming a light-shielding film by processing the electrically conductive film to form openings on the photodetector parts and form isolation regions between the photodetector parts, the isolation regions extending in the horizontal direction with respect to the first transfer electrodes.

BRIEF DESCRIPTION OF THE DRAWINGS

FIG. 5A is a plan view showing a step subsequent to FIG. 4A.

DETAILED DESCRIPTION OF THE INVENTION

Figure 1A:
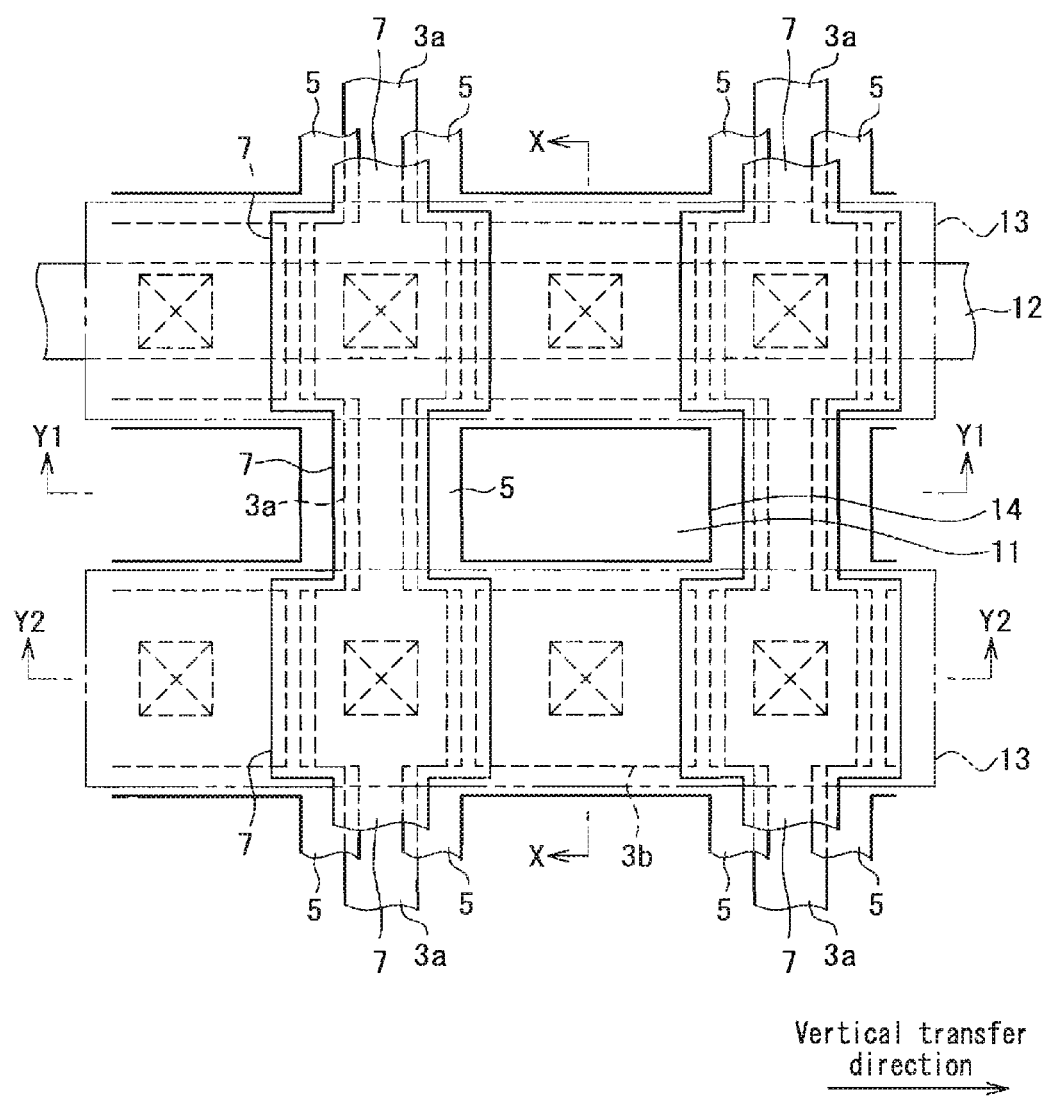
FIG. 1A is a plan view showing a configuration of a solid state imaging device according to Embodiment 1 of the present invention.

The present invention can be embodied as follows on the basis of the above-mentioned configuration.

Namely, in the solid state imaging device configured as described above, it is preferable that the isolation regions of the first light-shielding film are formed on the first transfer electrodes. This embodiment is further useful in suppressing the occurrence of smearing.

Also it is preferable that the solid state imaging device has a second light-shielding film that passes between the photodetector parts adjacent to each other in the vertical direction and that covers the isolation region of the first light-shielding film and traverses the transfer channels, where the second light-shielding film has electroconductivity and is connected electrically to the first transfer electrodes. Thereby, the speed of the transfer frequency can be enhanced with further reliability.

In the above-described embodiment, it is preferable that connection parts between the first transfer electrodes and the second light-shielding film are provided on an electrode in a region outside the vertical charge transfer part. Since the isolation width of the first light-shielding film should be increased around the connection parts, leakage of oblique incident light increases. According to this embodiment, however, since the leakage into the transfer channel can be suppressed, the occurrence of smearing can be suppressed more effectively.

Furthermore in the above-described embodiment, it is preferable that the second light-shielding film is arranged above the first light-shielding film. Thereby, the insulation film thickness between the transfer electrodes and the first light-shielding film can be decreased and thus the openings can be made larger. As a result, a higher sensitivity can be achieved and the occurrence of the smearing can be suppressed further.

In another embodiment of the solid state imaging device having the above-described configuration, the second light-shielding film is formed so that the side edge is positioned between the side edge of the first light-shielding film facing the isolation region and the side edge of the first light-shielding film at the photodetector part side. According to this embodiment, the occurrence of the smearing can be suppressed further effectively without sacrificing the sensitivity.

For another embodiment of the solid state imaging device of the above-described configuration, it is possible that the second transfer electrodes comprise a material having a low resistance in comparison with polysilicon. According to this embodiment, the speed of the transfer frequency can be enhanced further just like in the above embodiment, and furthermore, the connection parts between the second light-shielding film and the first transfer electrodes can be omitted, and thus the isolation width of the first light-shielding film can be set small at any portion. Thereby, the occurrence of smearing can be suppressed even further effectively. In addition, as the step of forming connection parts between the second light-shielding film and the first transfer electrode can be omitted, the term for manufacturing can be shortened and the yield can be improved.

In the above-described embodiment, it is preferable that the second light-shielding film comprises at least on the upper surface a light-shielding metallic material that has a low resistance in comparison with the polysilicon. According to this embodiment, since the second light-shielding film can be omitted, the manufacturing steps can be reduced and the yield is improved. Further, since the heights of the surfaces of the light receiving parts and a lens thereon can be decreased, further improvement in sensitivity and smearing suppression can be achieved.

It is preferable that in step (e), the step of forming the openings and the step of forming the isolation regions are carried out respectively as separate steps. According to this manufacturing method, a fine photoresist pattern becomes unnecessary, and thus the yield is improved.

Hereinafter, a solid state imaging device according to the embodiment of the present invention and a method of manufacturing the same will be described below with reference to the attached drawings.

Embodiment 1

A solid state imaging device according to Embodiment 1 of the present invention will be described below with reference to FIGS. 1A-3D. The solid state imaging device according to the present embodiment is a CCD type solid state imaging device having a shunt wiring structure. In the present embodiment, a light-shielding film provided on the upper layer of vertical charge transfer parts so as to be isolated in the vertical transfer direction. The light-shielding film shields optically the vertical charge transfer parts and also functions as a shunt wiring for applying a transfer pulse to transfer electrodes.

Figure 1B:
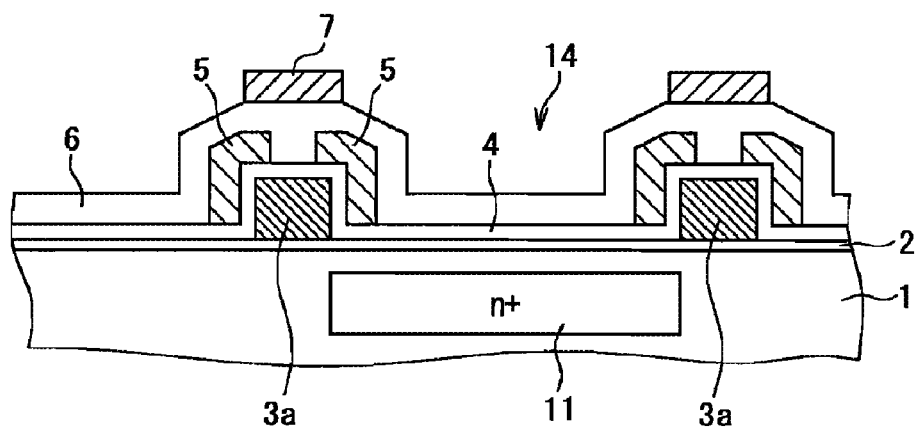
FIG. 1B is a cross sectional view taken along a line Y1-Y1 in FIG. 1A.
Figure 1C:
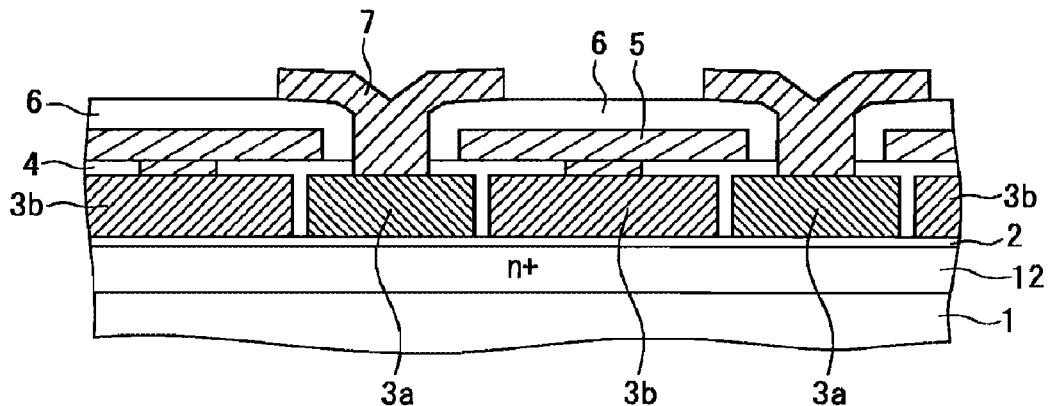
FIG. 1C is a cross sectional view taken along a line Y2-Y2 in FIG. 1A.
Figure 1D:
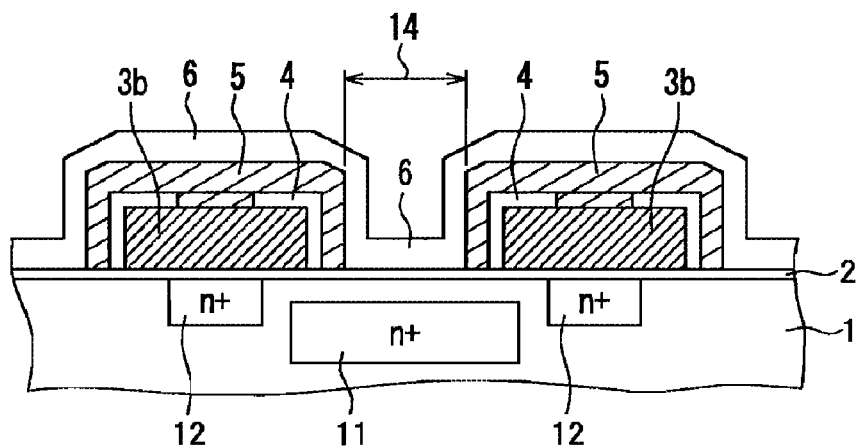
FIG. 1D is a cross sectional view taken along a line X-X in FIG. 1A.

FIG. 1A is a magnified plan view showing a portion of a solid state imaging device according to the present embodiment. FIG. 1B is a cross-sectional view taken along a line Y1-Y1, FIG. 1C is a cross-sectional view taken along a line Y2-Y2, and FIG. 1D is a cross-sectional view taken along a line X-X.

In the solid state imaging device shown in FIGS. 1A-1D, 11 denotes a plurality of photodetector parts that convert incident light into signal charge. For the purpose of reading out the signal charge from the photodetector parts 11 and transferring the signal charge in a vertical direction (the vertical transfer direction indicated with an arrow in FIG. 1A), a plurality of vertical charge transfer parts 13 including transfer channels 12 are provided. The plural vertical charge transfer parts 13 are provided for every vertical array of the photodetector part 11 as shown in FIG. 1A. For shielding the vertical charge transfer parts 13 from incident light, a first light-shielding film 5 and a second light-shielding film 7 are formed. Though not shown in FIGS. 1A-1D, a horizontal charge transfer part also is provided, and the horizontal charge transfer part transfers in the horizontal direction signal charge transferred by the vertical charge transfer parts 13.

The photodetector parts 11 are arranged in matrix. Further, as shown in FIG. 1B, the photodetector parts 11 are provided on a semiconductor substrate 1. In FIG. 1A, one of the photodetector parts 11 is shown through an opening 14. In the present embodiment, the semiconductor substrate 1 is a n-type silicon substrate. As shown in FIG. 1C, the transfer channel 12 is a n-type diffusion layer formed on the surface side of the semiconductor substrate 1.

On the transfer channels 12, first transfer electrodes 3a and second transfer electrodes 3b are provided to traverse the transfer channel 12. The first and second transfer electrodes 3a, 3b are formed on an insulating film 2 that covers the interface at the surface side of the semiconductor substrate 1. On each of the vertical charge transfer parts 13, the first transfer electrodes 3a and the second transfer electrodes 3b are arranged alternately along the vertical transfer direction. The first and second transfer electrodes 3a, 3b have a thickness of 0.2 µm, for example.

Furthermore, each of the first transfer electrodes 3a is coupled in the horizontal direction to another first transfer electrode 3a provided on an adjacent vertical charge transfer part 13, thereby configuring a wiring. For avoiding overlap with the photodetector parts 11, the wiring for connecting the first transfer electrodes 3a are formed to pass through the spacing between photodetector parts 11 adjacent in the vertical transfer direction, and the width is 0.4 µm for example.

The second transfer electrodes 3b are arranged in a state respectively isolated in the horizontal direction.

Insulating films 4 are formed on the side faces and upper surfaces of the first and second transfer electrodes 3a, 3b (see FIGS. 1B to 1C). The thickness of the insulating films 4 is 0.1 µm for example.

As described above, the solid state imaging device according to the present embodiment includes two kinds of light-shielding films, namely the first light-shielding film 5 and the second light-shielding film 7. Both the first light-shielding film 5 and the second light-shielding film 7 have electroconductivity.

For every photodetector part 11, the first light-shielding films 5 are arranged in a lattice form along the horizontal direction between the first transfer electrode 3a and the photodetector part 11, and connected in the horizontal direction. In the vertical transfer direction, the first light-shielding films 5 are isolated in the isolation region provided on the first transfer electrode 3a. The isolation width is 0.3 μm for example. The height of the first light-shielding film 5 in the region between the first transfer electrode 3a and the photodetector part 11 is about 0.3 μm. In the horizontal connection region, the width of the first light-shielding film 5 at the portion surmounted on the first transfer electrode 3a is about 0.15 μm. The size of the first light-shielding film 5 between the first transfer electrode 3a and the photodetector part 11, as the total of the above-mentioned height and the width, is about 0.45 μm. Since the first light-shielding film 5 is formed in a lattice shape as described above, the effective minimum wiring width is about 0.9 μm.

The second light-shielding film 7 is formed as an upper layer of the region where the first light-shielding film 5 is isolated, via an insulating film 6 that insulates the first light-shielding film 7 with respect to the first light-shielding film 5 and the first transfer electrodes 3a, and the second light-shielding film 7 has a function of preventing light from entering the transfer channel 12. The wiring has a width of 0.4 μm for example. The insulating film 6 is not shown in FIG. 1A.

The first light-shielding film 5 is connected electrically to the second transfer electrodes 3b via contacts. The second light-shielding film 7 is connected electrically to the first transfer electrodes 3a via contacts. Thereby, the first light-shielding film 5 and the second light-shielding film 7 function also as shunt wirings. In the present embodiment, as shown in FIGS. 1A and 1C, the contacts between the second light-shielding film 7 and the transfer electrode 3b are arranged on the upper layer of the vertical charge transfer part 13. The contact diameter is 0.2 μm for example. The distance between the contacts and the edge of the first light-shielding film 5 is 0.08 μm for example, and the isolation width of the first light-shielding film 5 is about 0.36 μm in the vicinity of a contact.

As described above, in the solid state imaging device according to the present embodiment, the first light-shielding film 5 and the second light-shielding film 7 function also as shunt wirings, and thus the shunt wiring width can be set to 3 times for example in comparison with a conventional technique, and the wiring resistance can be suppressed to one-third or lower in comparison with the conventional technique. The solid state imaging device according to the present embodiment is superior to a conventional solid state imaging device in that the speed of the transfer frequency can be enhanced as a result of reducing the resistance of the shunt wirings. Moreover, unlike the conventional example, since the first light-shielding film 5 connected in the horizontal direction functions as a shunt wiring, there is no necessity to arrange a plurality of shunt wirings on the first transfer electrodes 3a. Therefore, the wiring width of the first transfer electrodes 3a can be decreased in comparison with a conventional example. In other words, the openings with respect to the photodetector parts 11 can be made larger. As a result, the sensitivity can be improved and the occurrence of smearing can be suppressed further in comparison with the conventional example.

In the above-described example, the contacts between the second light-shielding film 7 and the first transfer electrodes 3a are arranged on the upper layer of the vertical charge transfer parts 13. In an alternative embodiment, as shown in FIGS. 2A-2C, it is preferable that such a contact is arranged on a region other than the vertical charge transfer part 13, namely, a position where the first transfer electrodes 3a are coupled to each other.

Figure 2A:
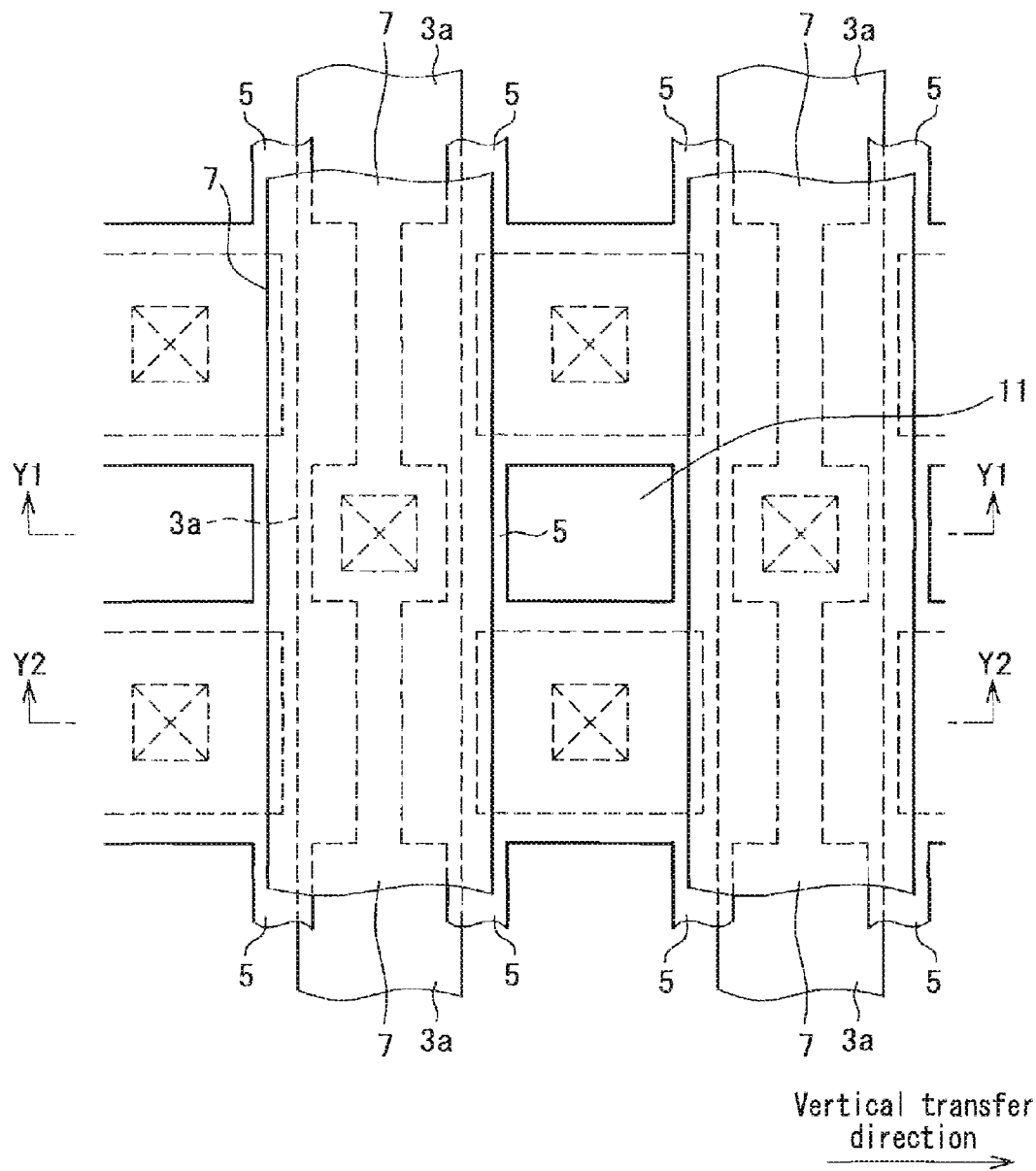
FIG. 2A is a plan view showing a configuration of a solid state imaging device in another aspect according to Embodiment 1 of the present invention.
Figure 2B:
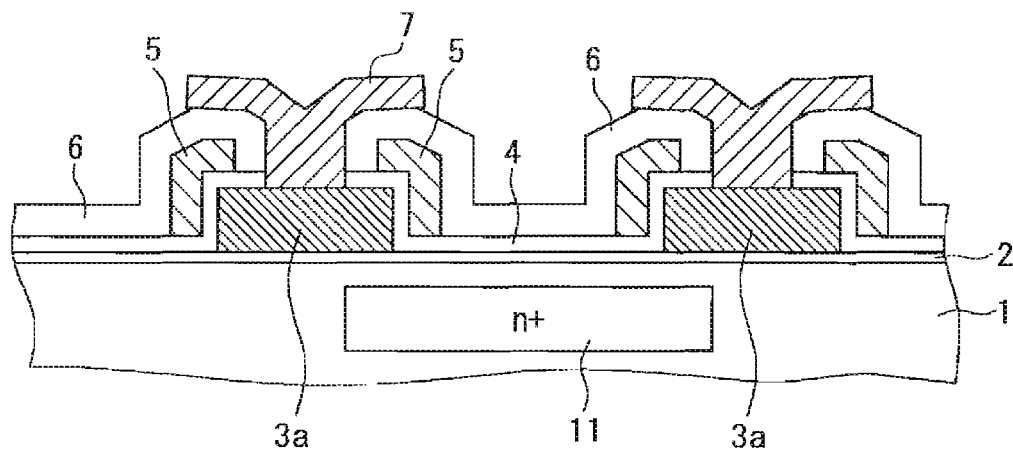
FIG. 2B is a cross sectional view taken along a line Y1-Y1 in FIG. 2A.
Figure 2C:
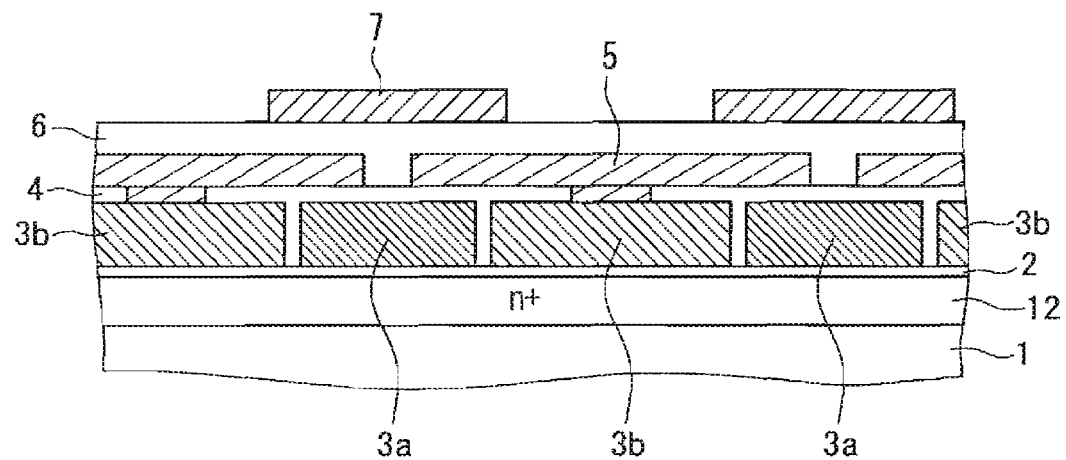
FIG. 2C is a cross sectional view taken along a line Y2-Y2 in FIG. 2A.

FIG. 2A is a magnified plan view showing a portion of a solid state imaging device, FIG. 2B is a cross-sectional view thereof taken along a line Y1-Y1, and FIG. 2C is a cross-sectional view thereof taken along a line Y2-Y2. Components common to those shown in FIGS. 1A-1D are assigned with the identical reference numerals in order to avoid repetition of explanation.

In the present embodiment, a contact between the second light-shielding film 7 and the first transfer electrode 3a is formed on a region shown in the cross sectional view of FIG. 2B. As shown in FIG. 2B, the isolation width of the first light-shielding film 5 should be increased at the position for forming a contact. Therefore, in the example as shown in FIGS. 1A-1D, the isolation width of the first light-shielding film 5 is increased above the vertical charge transfer part 13 (the transfer channel 12) (see FIG. 1C). In contrast, according to this alternative embodiment, the first light-shielding film 5 can be arranged such that the region with the maximum isolation width is positioned separately from the transfer channel 12, and thus leakage of obliquely entering light into the transfer channel 12 can be suppressed.

Figure 3A:
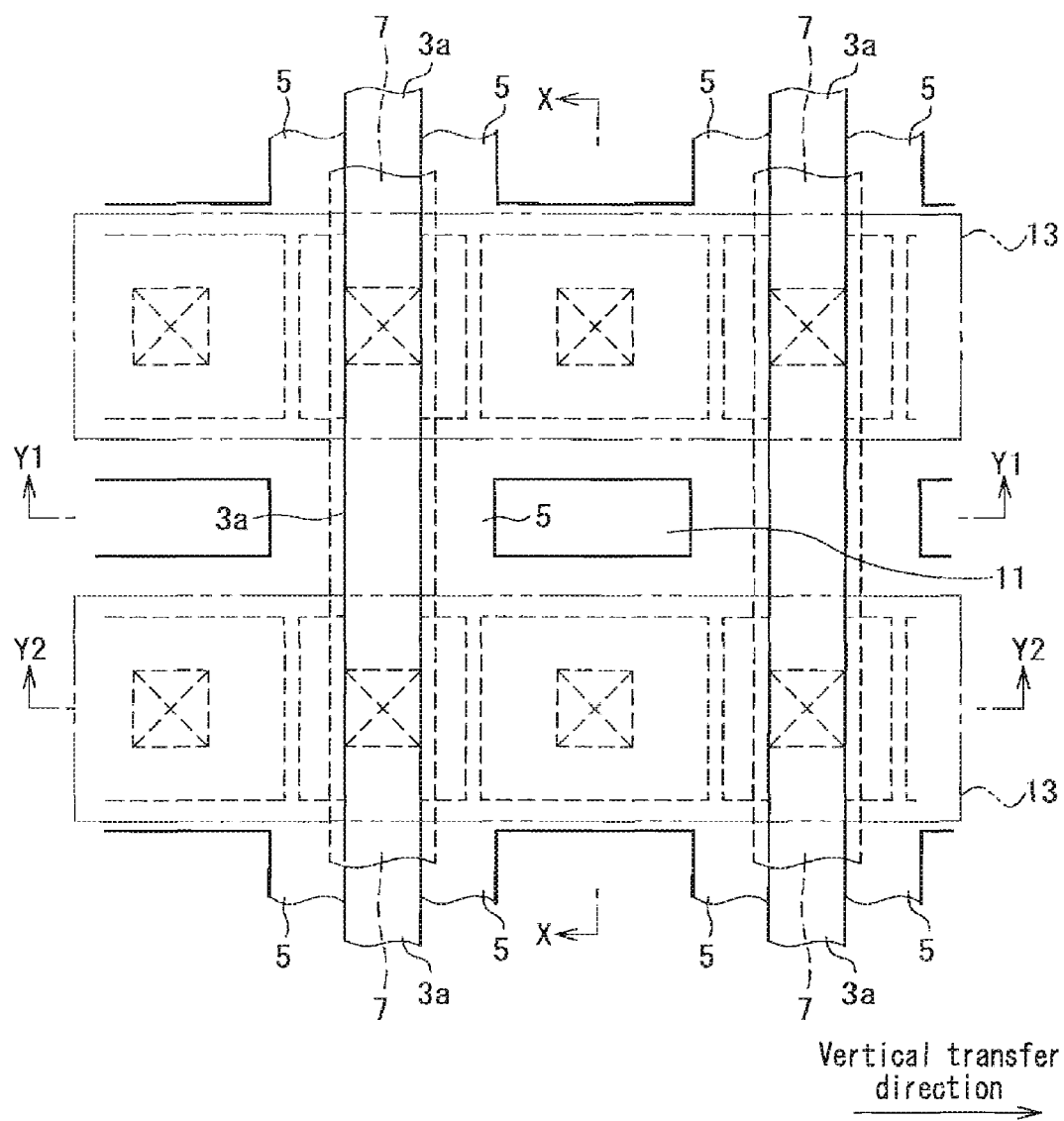
FIG. 3A is a plan view showing a configuration of a solid state imaging device different from Embodiment 1 of the present invention.
Figure 3B:
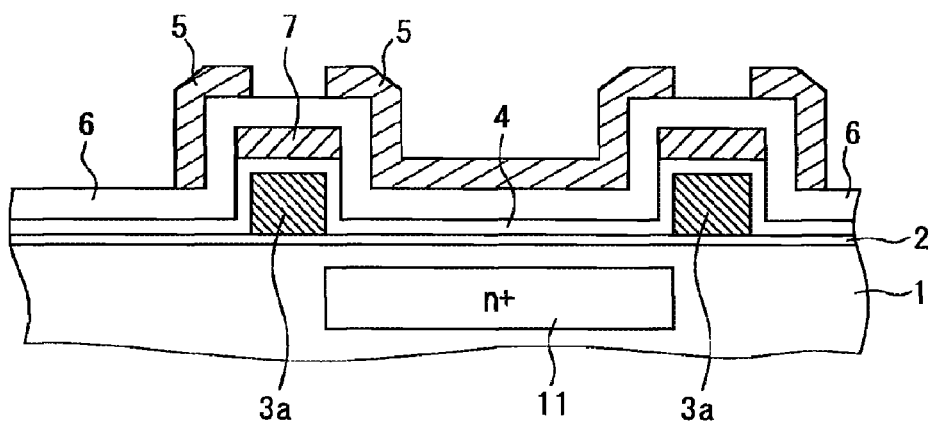
FIG. 3B is a cross sectional view taken along a line Y1-Y1 in FIG. 3A.
Figure 3C:
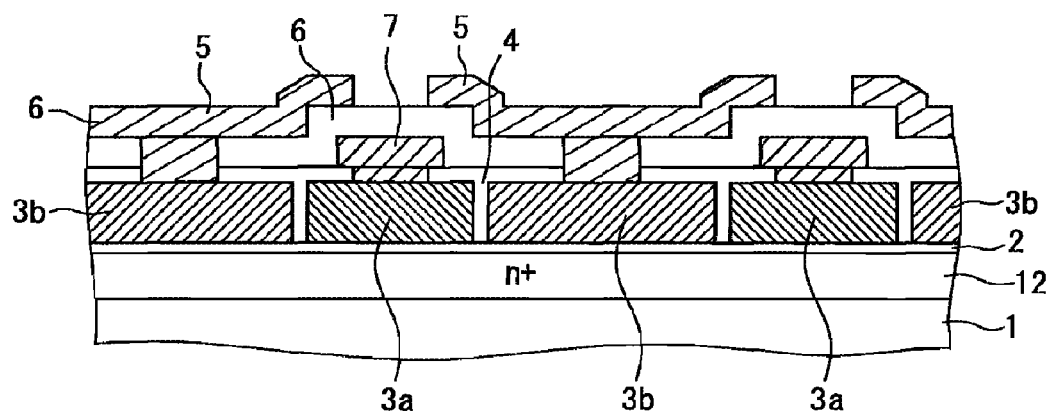
FIG. 3C is a cross sectional view taken along a line Y2-Y2 in FIG. 3A.
Figure 3D:
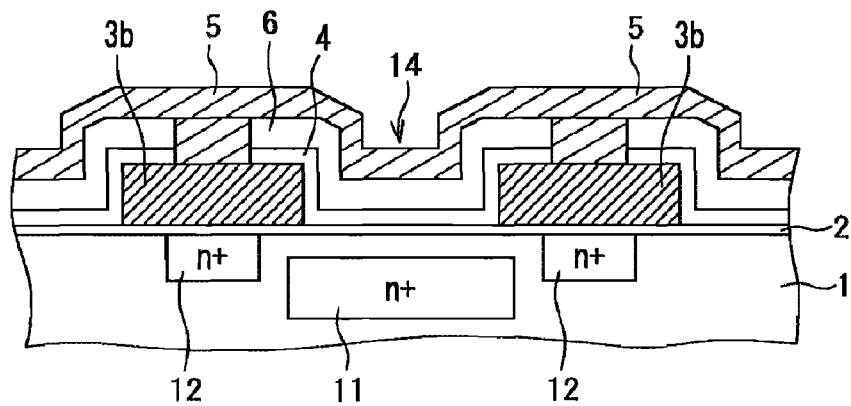
FIG. 3D is a cross sectional view taken along a line X-X in FIG. 3A.

In the present embodiment, the first light-shielding film 5 is formed below the second light-shielding film 7 for the purpose of enlarging the opening width. When the second light-shielding film 7 is formed below the first light-shielding film 5, problems as shown in FIGS. 3A-3D may occur. FIG. 3A is a magnified plan view showing a portion of a solid state imaging device according to the present embodiment, FIG. 3B is a cross-sectional view thereof taken along a line Y1-Y1, FIG. 3C is a cross-sectional view thereof taken along a line Y2-Y2, and FIG. 3D is a cross-sectional view thereof taken along a line X-X. Components common to those shown in FIGS. 1A-1D are assigned with the identical reference numerals in order to avoid repetition of explanation.

Namely, as shown in FIG. 3D for this configuration, insulating films 4 and 6 are formed between the first and second transfer electrodes 3a, 3b and the first light-shielding film 5. Therefore, the width of the opening 14 determined depending on the position of the first light-shielding film 5 interposing the insulating films 4 and 6 is decreased. On the other hand, when the first light-shielding film 5 is formed below the second light-shielding film 7 as in the present embodiment, only an insulating film 4 is formed between the first and second transfer electrodes 3a, 3b and the first light-shielding film 5, and thus the width of the opening 14 will be increased.

Since the thickness of the insulating film 6 is set to 0.15 μm for example in view of the pressure resistance of the first light-shielding film 5 and the second light-shielding film 7, the opening width in the present embodiment can be increased by 0.3 μm in comparison with an embodiment where the second light-shielding film 7 is formed below the first light-shielding film 5. Therefore, it is preferable that the first light-shielding film 5 is formed below the second light-shielding film 7.

It is further preferable that the second light-shielding film 7 is formed, as shown in FIGS. 1A and 1C, so that the side edge is positioned between the side edge of the first light-shielding film 5 in the region where the first light-shielding film 5 is isolated and the side edge of the first light-shielding film 5 at the side of the photodetector part 11. Alternatively, the side edge of the second light-shielding film 7 can be aligned with the side edge of the first light-shielding film 5. Thereby, the risk that oblique light enters the transfer channel 12 can be minimized without decreasing the size of the opening 14.

Next, a method of manufacturing the solid state imaging device according to Embodiment 1 will be described with reference to FIGS. 4A-9C. FIGS. 4A-9C are views showing a method of manufacturing the solid state imaging device according to Embodiment 1 as shown in FIGS. 1A-1D. FIGS.

4A, 5A, 6A, 7A, 8A and 9A are plan views; FIGS. 4B, 5B, 6B, 7B, 8B and 9B are cross-sectional views taken along lines Y1-Y1; and FIGS. 4C, 5C, 6C, 7C, 8C and 9C are cross-sectional views taken along lines Y2-Y2.

Figure 4A:
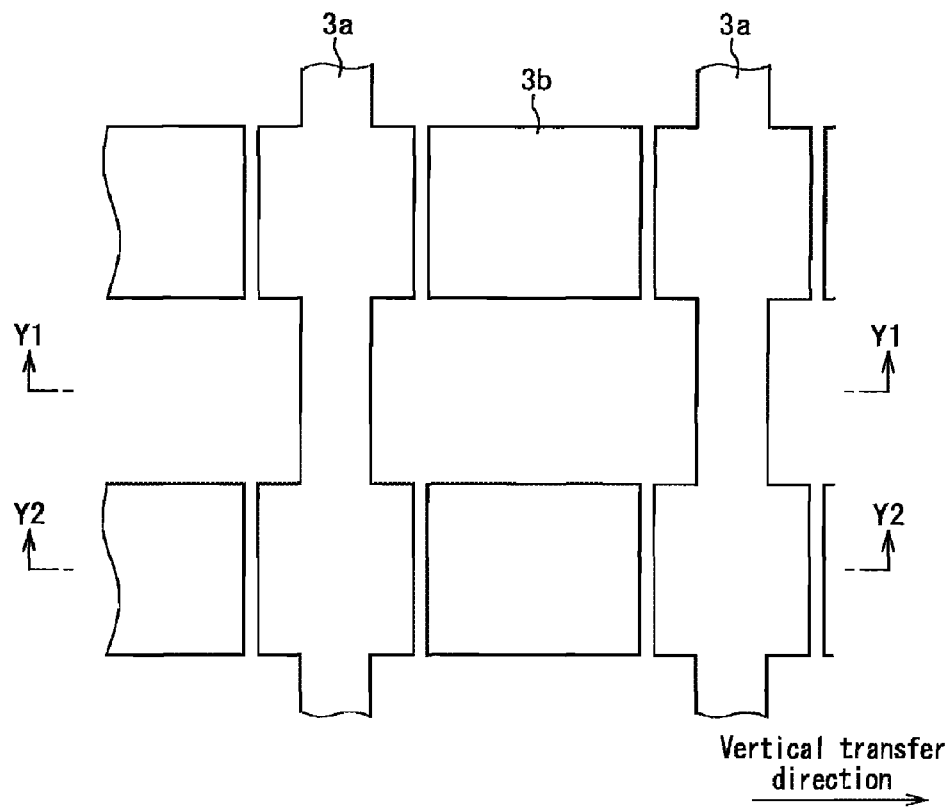
FIG. 4A is a plan view showing a method of manufacturing a solid state imaging device according to Embodiment 1 of the present invention.
Figure 4B:
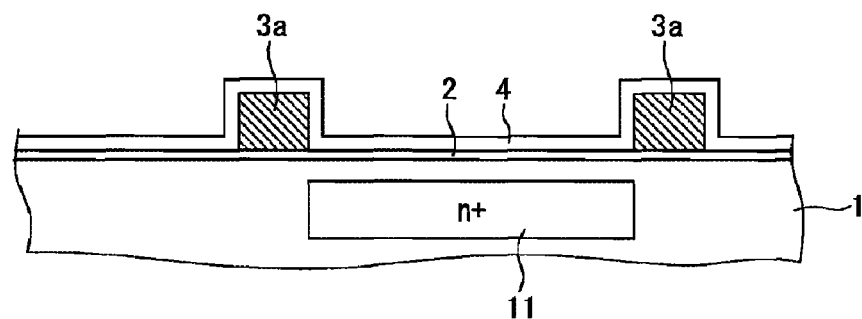
FIG. 4B is a cross sectional view taken along a line Y1-Y1 in FIG. 4A.
Figure 4C:
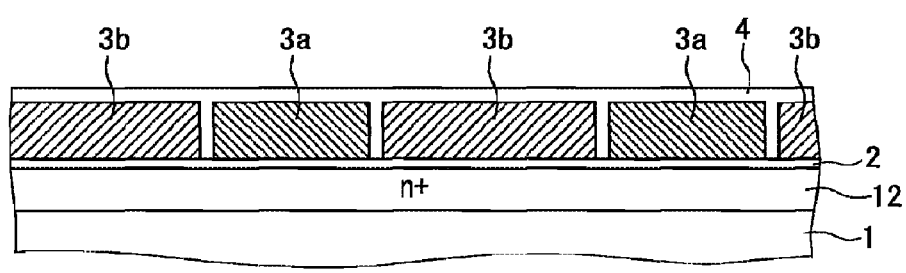
FIG. 4C is a cross sectional view taken along a line Y2-Y2 in FIG. 4A.

First, as shown in FIGS. 4B and 4C, an insulating film 2 is formed on the surface of the semiconductor substrate 1 by the thermal oxidation method. At this time, the thickness of the insulating film 2 is set to a range of 20 nm to 40 nm. Subsequently, the semiconductor substrate 1 is subjected to formation of various resist patterns and ion implantation. Thereby, photodetector parts 11 and the transfer channel 12 are formed.

Next, an electrically conductive film such as a polysilicon film is formed, which is etched by using the photolithographic method, thereby transfer electrodes 3a, 3b are formed as shown in FIGS. 4A-4C. Further, an insulating film 4, which covers the surfaces and side faces of the transfer electrodes 3a, 3b, is also formed by the thermal oxidation method.

In the present embodiment, formation of the insulating films 2 and 4 are carried out by the thermal oxidation method, but it is not limited to this example. For instance, the insulating films 2, 4 can be formed by a film formation method such as a CVD method.

Figure 5B:
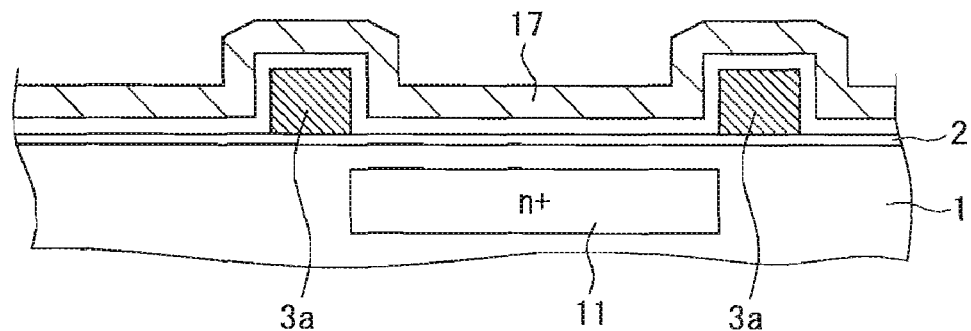
FIG. 5B is a cross sectional view taken along a line Y1-Y1 in FIG. 5A.
Figure 5C:
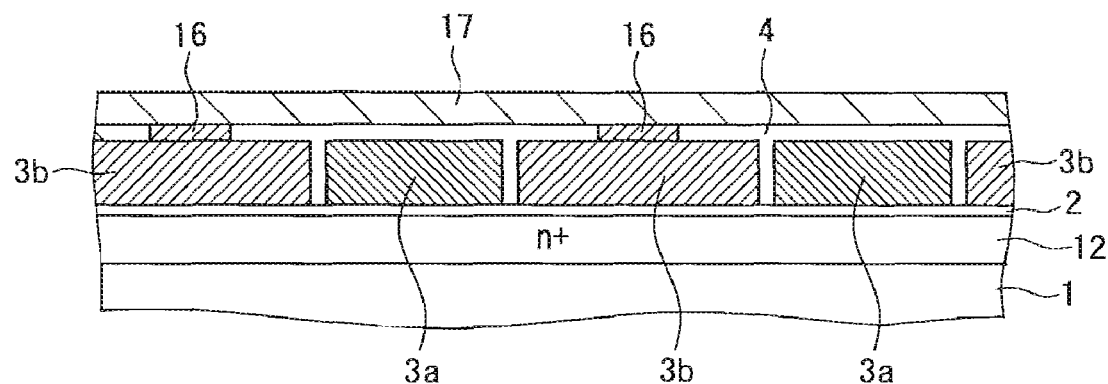
FIG. 5C is a cross sectional view taken along a line Y2-Y2 in FIG. 5A.

Next, as shown in FIGS. 5A-5C, contacts 16 are formed on the second transfer electrodes 3b, and an electrically conductive film 17 that covers the whole upper surface of the semiconductor substrate 1 including the transfer electrodes 3a, 3b is formed. Specifically, for example, a light-shielding metallic thin film made of tungsten or the like is formed by using a CVD method or a sputtering method. The thickness of this electrically conductive film 17 (light-shielding metallic thin film) is set to a range of 60 nm to 120 nm, for example. The electrically conductive film 17 is in a state connected electrically to the second transfer electrodes 3b by the contacts 16.

Figure 6A:
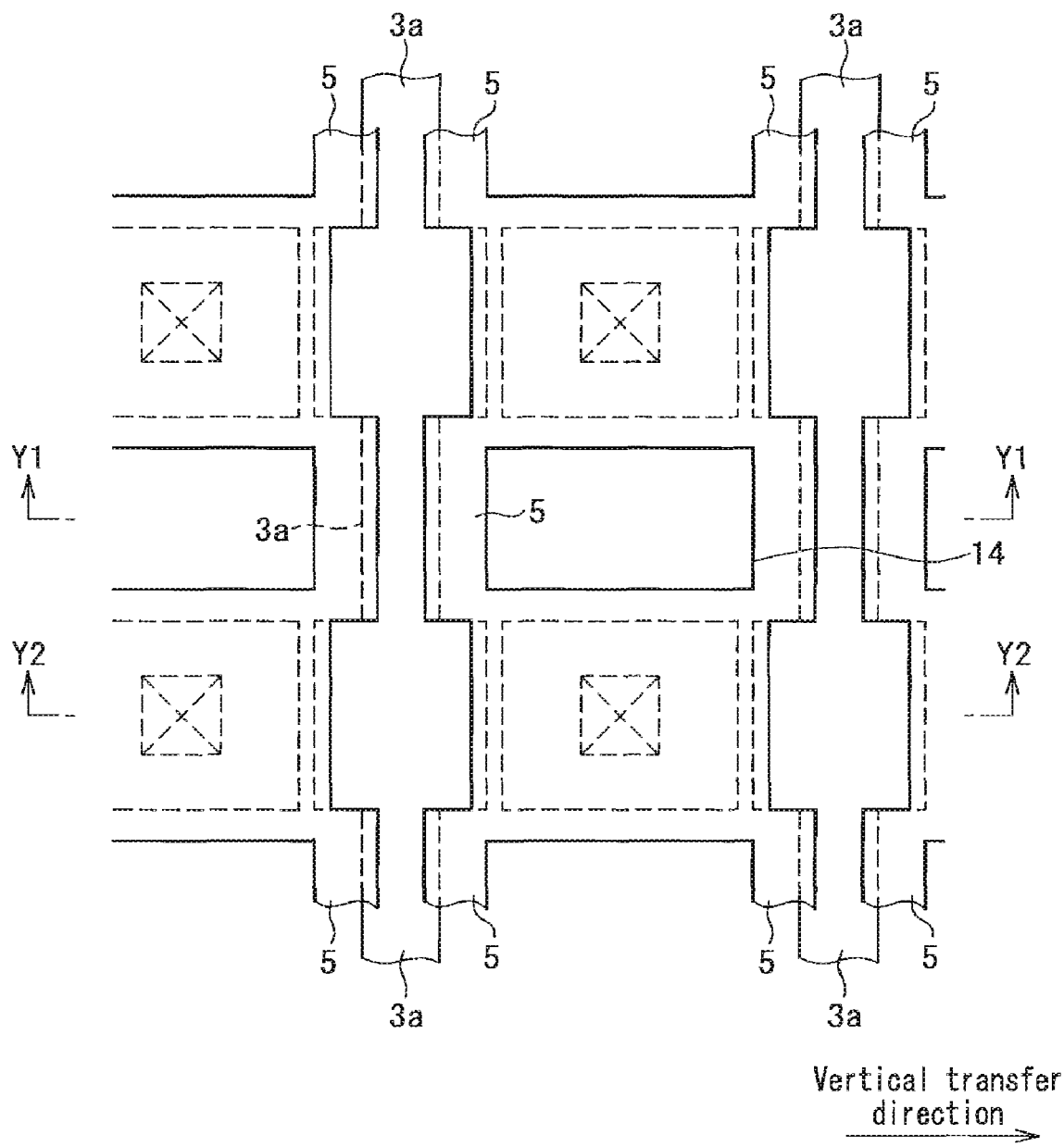
FIG. 6A is a plan view showing a step subsequent to FIG. 5A.
Figure 6B:
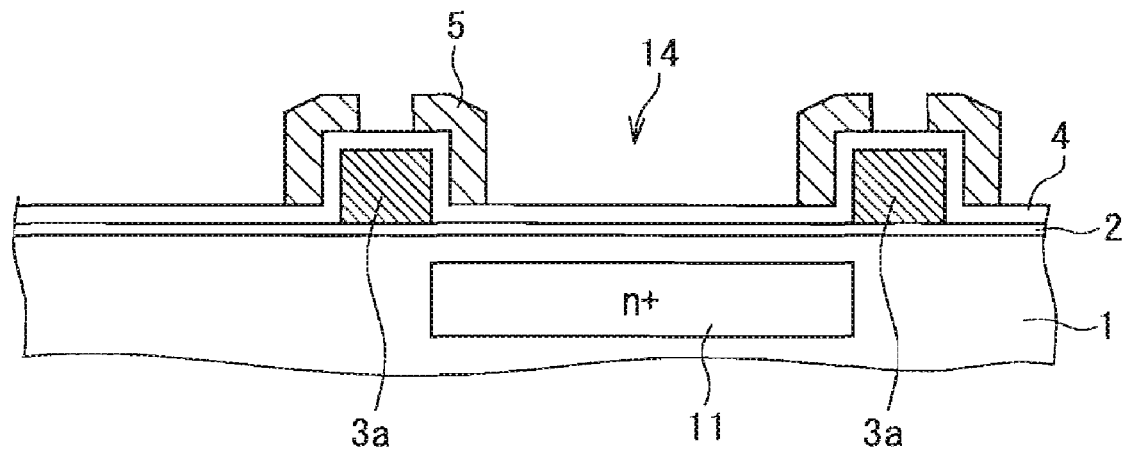
FIG. 6B is a cross sectional view taken along a line Y1-Y1 in FIG. 6A.
Figure 6C:
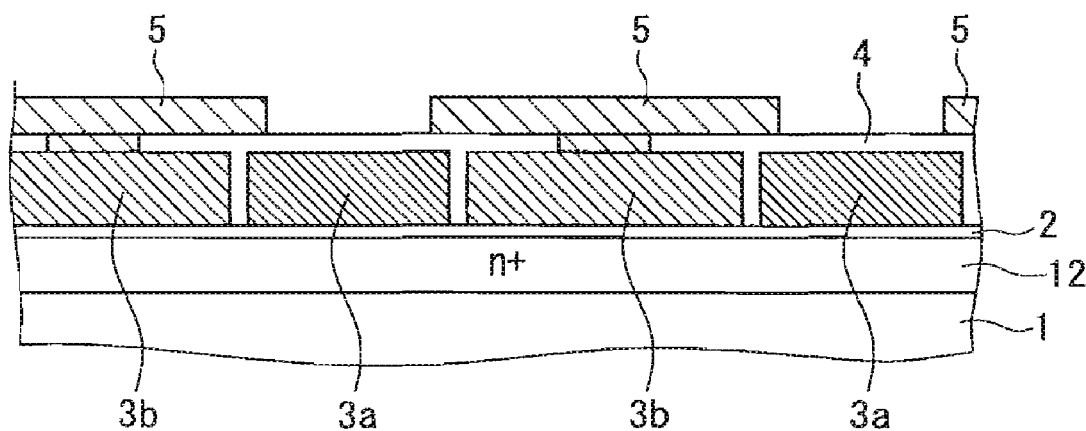
FIG. 6C is a cross sectional view taken along a line Y2-Y2 in FIG. 6A.

Next, as shown in FIGS. 6A-6C, etching is carried out by using the photolithographic method, thereby the first light-shielding film 5 is formed.

Here, it is preferable that the first light-shielding film 5 is formed by a step of isolating the electrically conductive film 17 in the horizontal direction and a step of forming openings 14 on the photodetector parts 11. Thereby, formation of a fine photoresist pattern is not required, and thus the yield is improved.

Figure 7A:
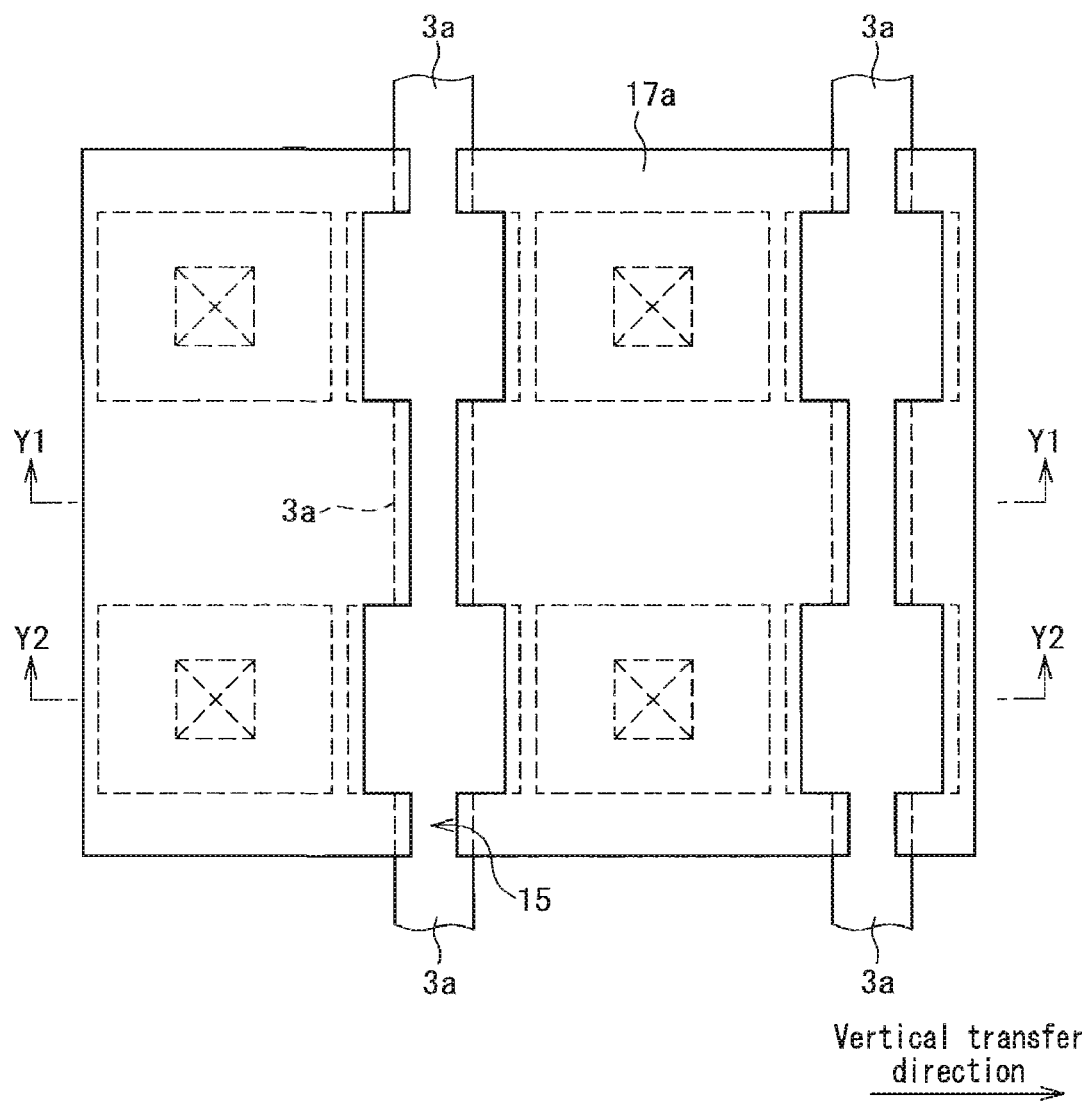
FIG. 7A is a plan view showing more specifically the step shown in FIG. 6A.
Figure 7B:
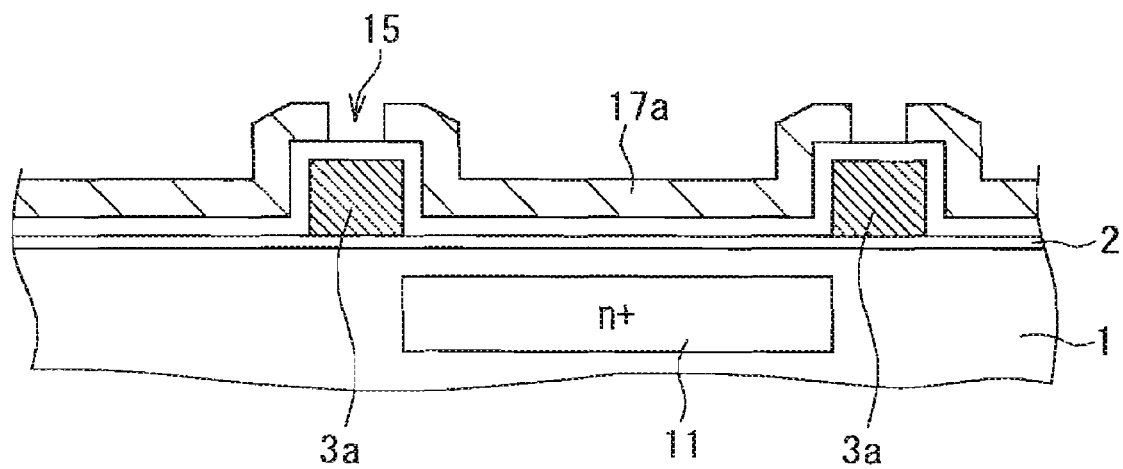
FIG. 7B is a cross sectional view taken along a line Y1-Y1 in FIG. 7A.
Figure 7C:
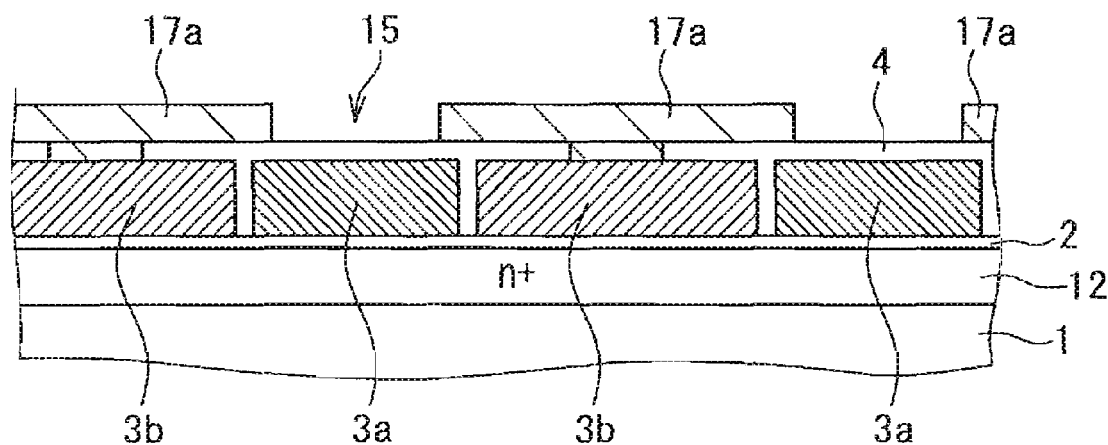
FIG. 7C is a cross sectional view taken along a line Y2-Y2 in FIG. 7A.

Specifically, as shown in FIGS. 7A-7C, the electrically conductive film 17 on the first transfer electrodes 3a is etched by using the photolithographic method, on which isolation parts 15 are provided so as to form isolated electrically conductive films 17a that are isolated from each other in the horizontal direction. Next, the isolated electrically conductive films 17a on the photodetector parts 11 are etched by using the photolithographic method so as to form the openings 14 as shown in FIG. 6A, thereby the first light-shielding film 5 is formed.

Figure 8A:
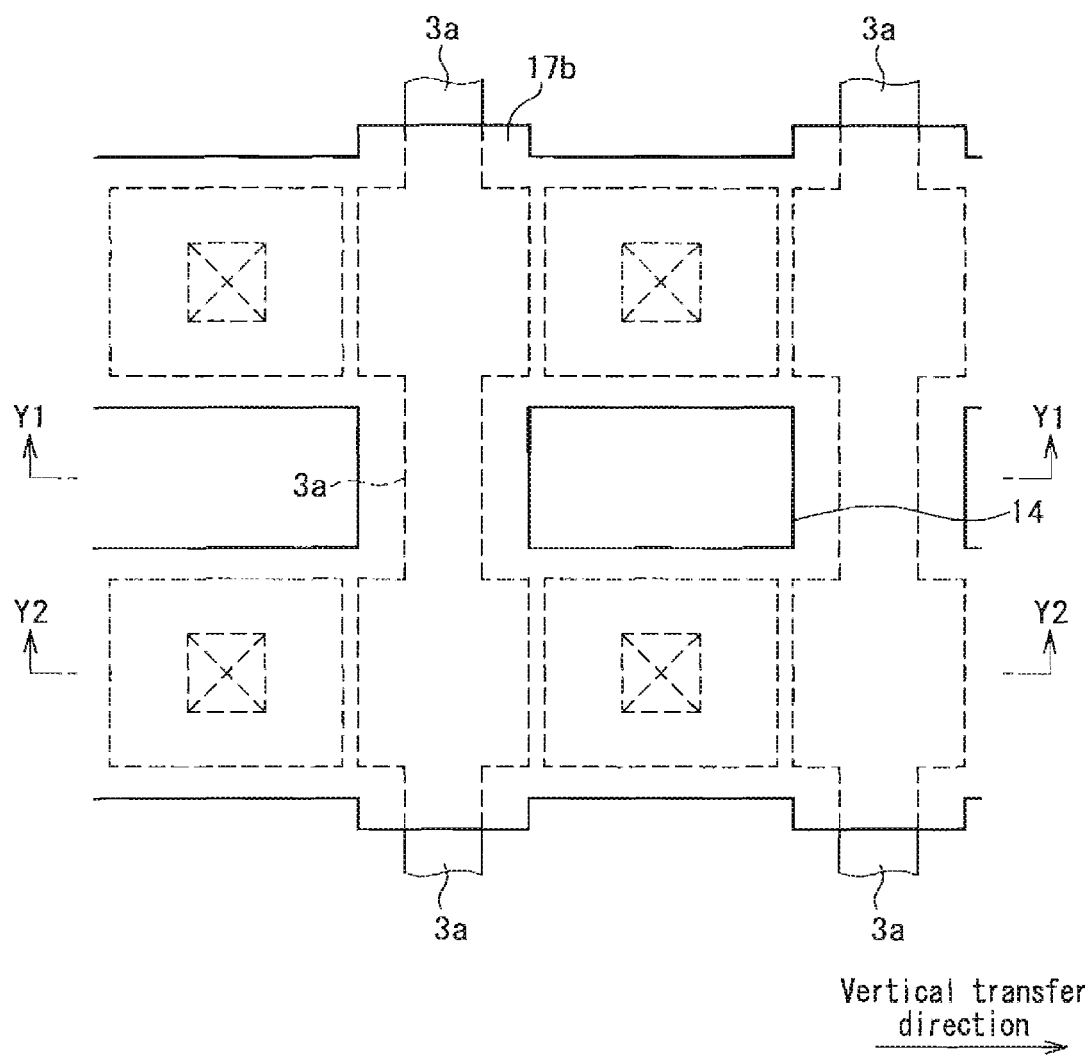
FIG. 8A is a plan view showing a step different from FIG. 7A.
Figure 8B:
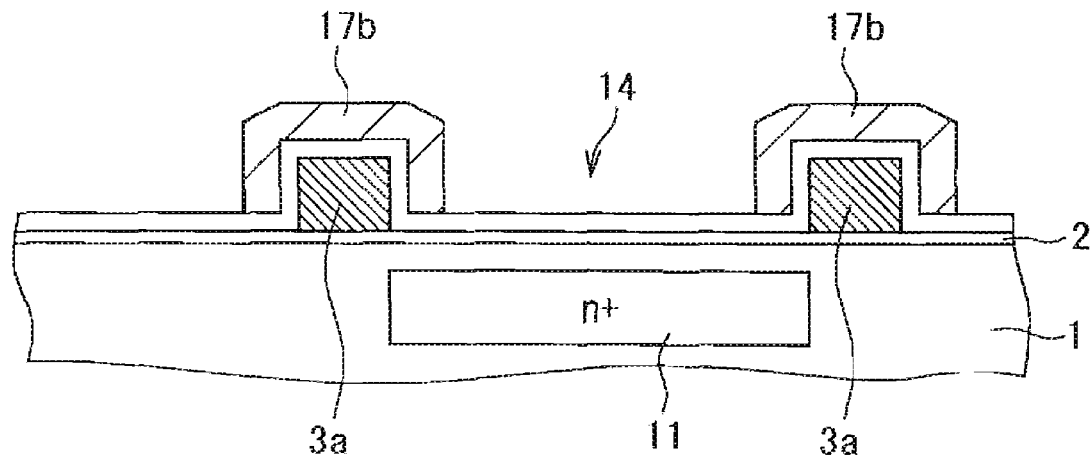
FIG. 8B is a cross sectional view taken along a line Y1-Y1 in FIG. 8A.
Figure 8C:
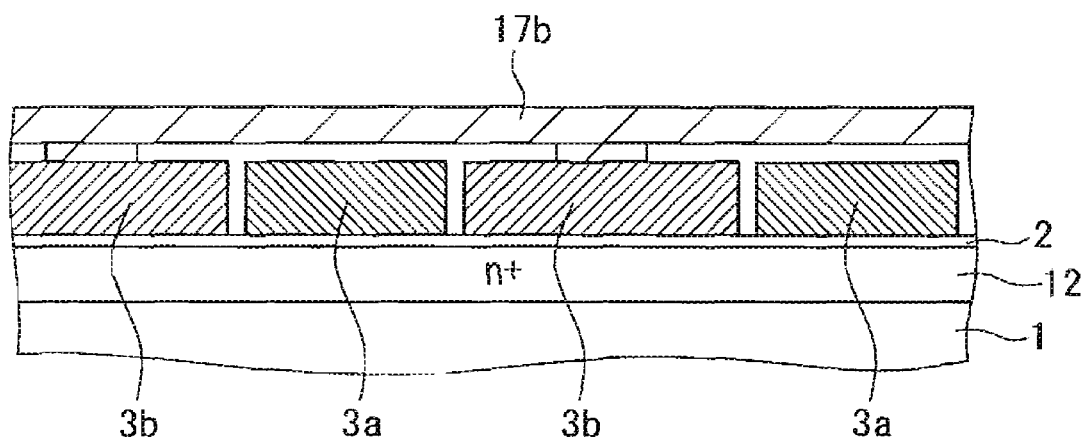
FIG. 8C is a cross sectional view taken along a line Y2-Y2 in FIG. 8A.

In the above-described manufacturing process for forming the first light-shielding film 5, the electrically conductive film 17 is isolated in the horizontal direction and subsequently the openings 14 on the photodetector parts 11 are formed. It should be noted, however, the process is not limited to this example. Namely, as shown in FIGS. 8A-8C, it is also possible to form first the openings 14 on the photodetector parts 11 so as to provide opened electrically conductive film 17b, which is isolated subsequently in the horizontal direction so as to form the first light-shielding film 5.

Figure 9A:
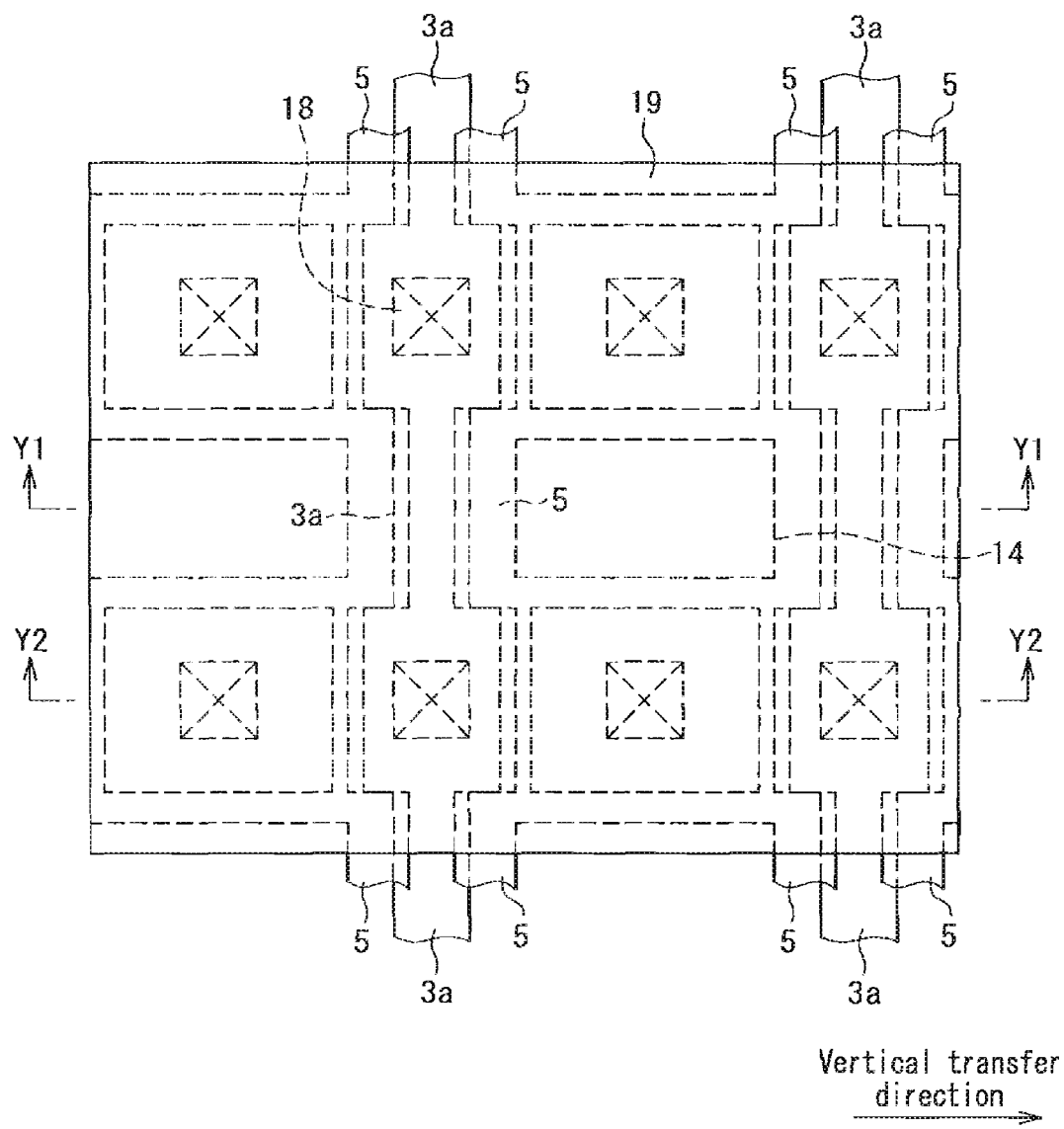
FIG. 9A is a plan view showing a step subsequent to FIG. 6A.
Figure 9B:
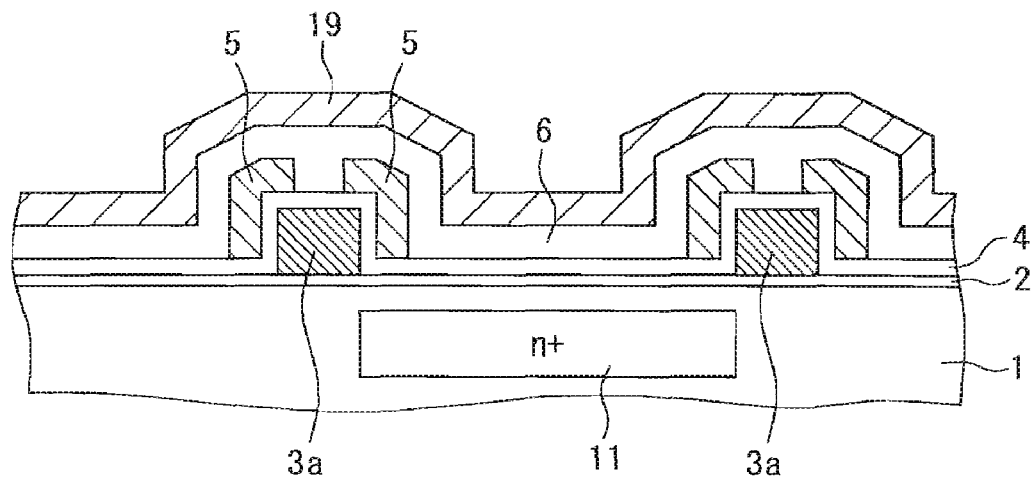
FIG. 9B is a cross sectional view taken along a line Y1-Y1 in FIG. 9A.
Figure 9C:
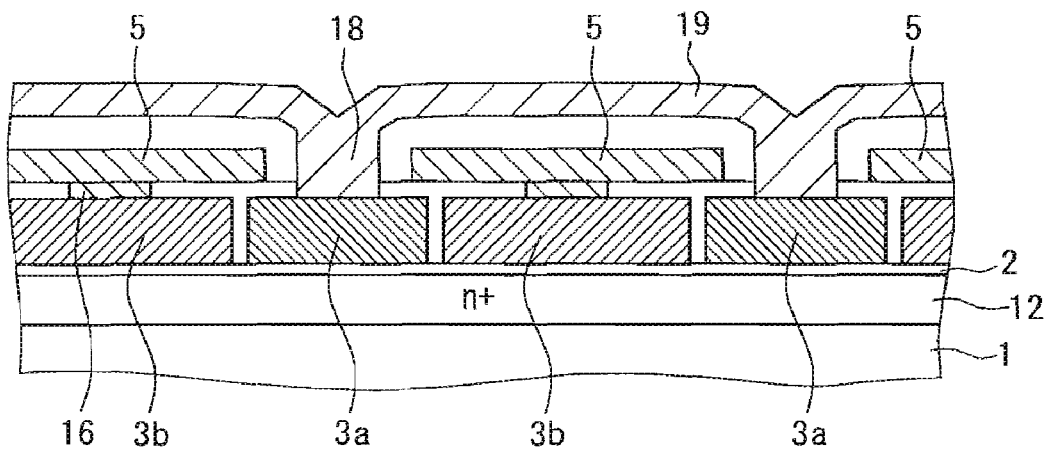
FIG. 9C is a cross sectional view taken along a line Y2-Y2 in FIG. 9A.

After the steps as shown in FIGS. 6A-6C, an insulating film 6 is formed as shown in FIGS. 9A-9C so as to cover the whole upper surface of the semiconductor substrate 1 including the first light-shielding film 5 and the transfer electrodes 3a, 3b. Further, contacts 18 are formed on the first transfer electrodes 3a, and an electrically conductive film 19 is formed for covering the whole upper surface of the semiconductor substrate 1 including the transfer electrodes 3a, 3b. The electrically conductive film 19 is made of a light-shielding metallic thin film just like the electrically conductive film 17. The thickness of the electrically conductive film 19 is set to a range of 60 nm to 120 nm, for example. The electrically conductive film 19 is in a state electrical connection to the first transfer electrodes 3a by the contacts 18.

Next, etching by use of a photolithographic method is carried out, thereby the second light-shielding film 7 as shown in FIGS. 1A-1C is formed. At this time, the photoresist pattern is formed so that the side edge of the thus obtained second light-shielding film 7 is positioned between the side edge of the first light-shielding film 5 in the region where the first light-shielding film 5 is isolated and the side edge of the first light-shielding film 5 at the side of the photodetector part 11. Alternatively, the side edge of the second light-shielding film 7 can be aligned with the side edge of the first light-shielding film 5. The position of the edge of the resist pattern is adjusted in view of the amount of the dimensional shift caused by the etching.

Subsequently, an insulating film such as BPSG (Boron Phosphorous Silicate Glass) film, a lens element and the like are formed further as required (not shown).

As described above, by carrying out the steps as shown in FIGS. 4A-9C, the solid state imaging device as shown in FIGS. 1A-1D is obtained. The solid state imaging device as shown in FIGS. 2A-2C can be manufactured in the substantially same steps. With the thus manufactured solid state imaging device, high-speed picture-taking can be carried out at a high sensitivity and with reduced smearing.

Embodiment 2

Figure 10A:
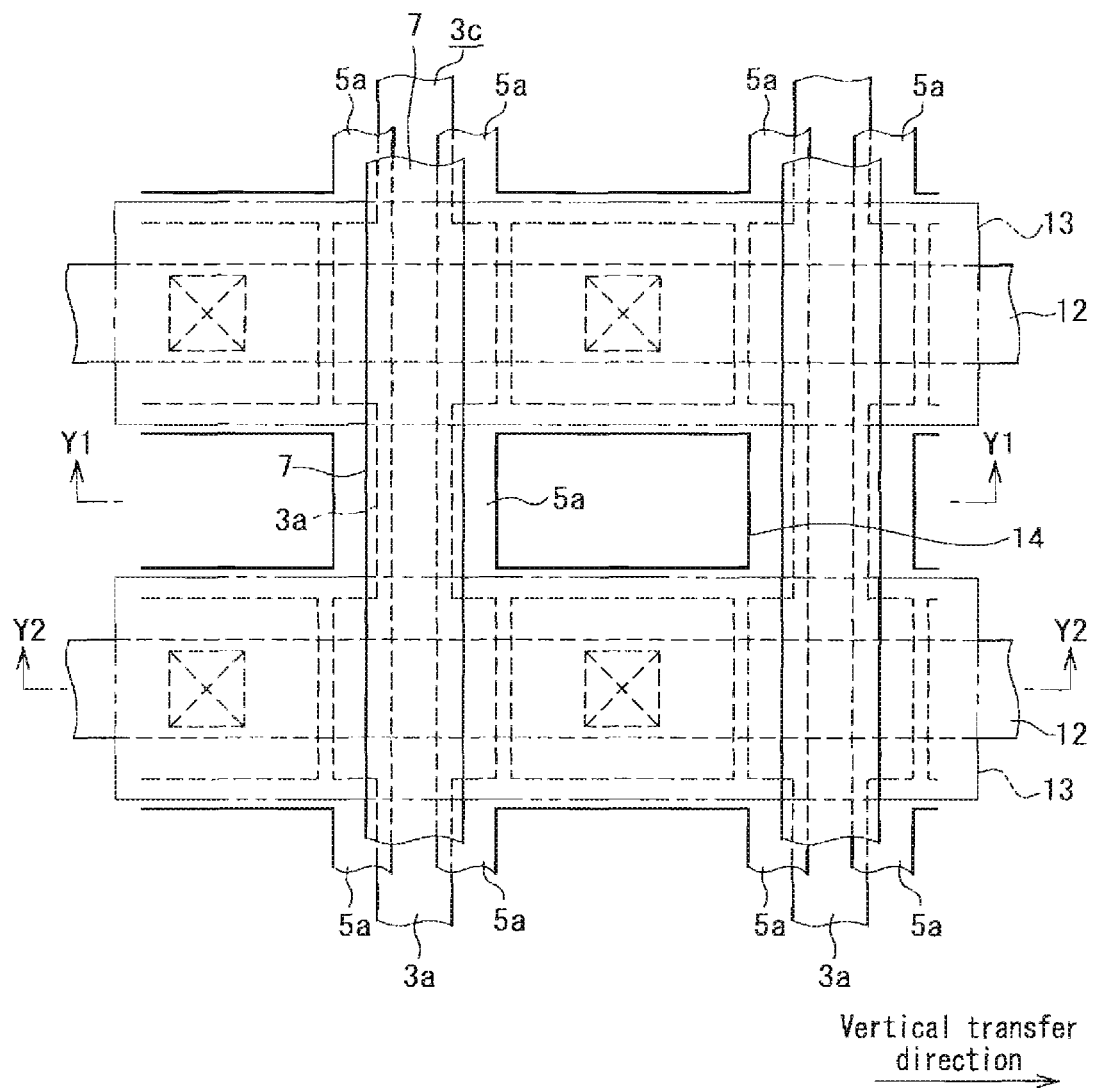
FIG. 10A is a plan view showing a configuration of a solid state imaging device according to Embodiment 2 of the present invention.
Figure 10B:
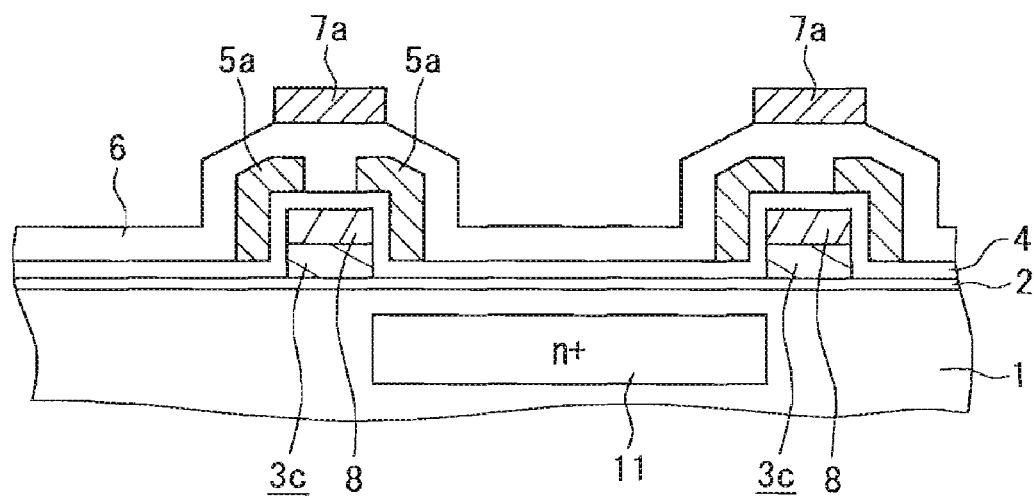
FIG. 10B is a cross sectional view taken along a line Y1-Y1 in FIG. 10A.
Figure 10C:
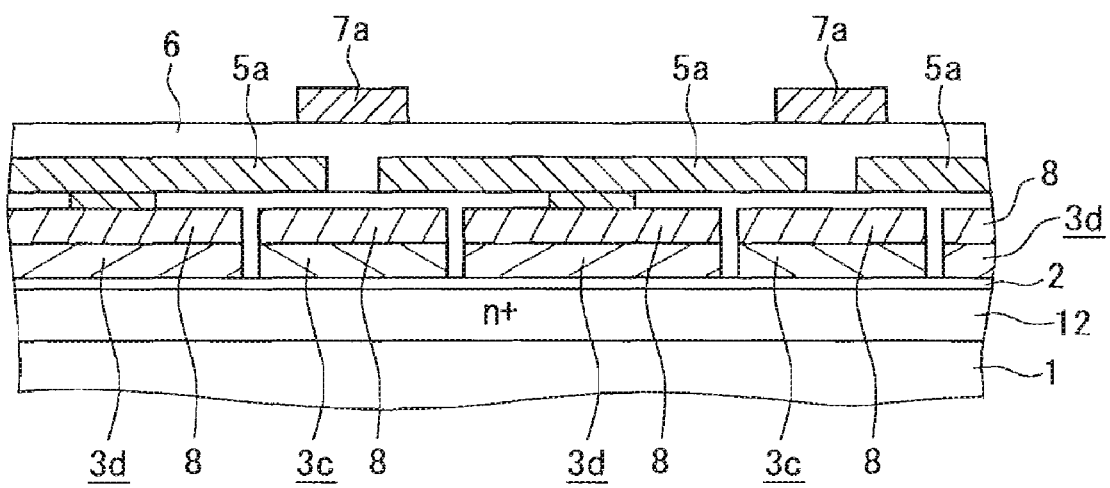
FIG. 10C is a cross sectional view taken along a line Y2-Y2 in FIG. 10A.

A solid state imaging device and a method of manufacturing the same according to Embodiment 2 of the present invention will be described below with reference to FIGS. 10A-11C. First, the configuration of the solid state imaging device according to Embodiment 2 will be described with reference to FIGS. 10A-10C. FIG. 10A is a magnified plan view showing a portion of the solid state imaging device according to Embodiment 2, FIG. 10B is a cross-sectional view thereof taken along a line Y1-Y1, and FIG. 10C is a cross-sectional view thereof taken along a line Y2-Y2. Components common to those shown in FIGS. 1A-1D are assigned with the identical reference numerals in order to avoid repetition of explanation.

As shown in FIGS. 10A-10C, the solid state imaging device according to the present embodiment also is a CCD type solid state imaging device having a shunt wiring structure similar to the solid state imaging device according to Embodiment 1. Similarly in the present embodiment, a lattice-like first light-shielding film provided on the upper layer of the vertical charge transfer parts shields optically the vertical charge transfer parts and at the same time functions as a shunt wiring for applying a transfer pulse to the second transfer electrodes.

The solid state imaging device according to the present embodiment is different from the solid state imaging device according to Embodiment 1 in the configurations of the first and second transfer electrodes 3c, 3d, the first light-shielding film 5a, and the second light-shielding film 7a. The differences will be specified below.

Unlike the transfer electrodes 3a, 3b as shown in Embodiment 1, the transfer electrodes 3c, 3d according to the present embodiment include a low-resistance material 8 whose resistance is lower than that of a polysilicon film, as shown in FIGS. 10B and 10C. For the low-resistance material 8, specifically for instance, titanium silicide, cobalt silicide, tungsten silicide and the like can be used.

The low-resistance material 8 is not necessarily included in both the first transfer electrodes 3c and the second transfer electrodes 3d as long as the low-resistance material 8 is included at least in the first transfer electrodes 3c.

Furthermore, as shown in FIG. 10C, in the present embodiment, the second light-shielding film 7a is not connected electrically to the first transfer electrodes 3c unlike Embodiment 1. Therefore, there is no contact for connecting electrically the second light-shielding film 7a to the first transfer electrodes 3c. As a result, unlike Embodiment 1, the isolation width of the first light-shielding film 5a can be set to have a uniform size of about 0.3 μm for example.

As described above, the second light-shielding film 7a is not connected electrically to the first transfer electrodes 3c. However, since the first transfer electrodes 3c themselves include the low-resistance material 8, the thus obtained solid state imaging device is superior to a conventional solid state imaging device in that the speed of the transfer frequency can be enhanced just like in Embodiment 1.

Further, since the isolation width of the first light-shielding film 5a can be set small over the entire regions, it is possible to obtain more sufficiently the effect of suppressing leakage of oblique light into the vertical charge transfer parts 13.

Further, since the step of forming connection parts between the second light-shielding film 7a and the first transfer electrodes 3c becomes unnecessary, the term for manufacturing can be shortened and the yield can be improved.

Next, a method of manufacturing a solid state imaging device in Embodiment 2 will be described below with reference to FIGS. 11A-11C, focusing on the differences from the manufacturing method in Embodiment 1.

First, similarly to Embodiment 1, an insulating film 2 is formed on the surface of the semiconductor substrate 1 by the thermal oxidation method. At this time, the thickness of the insulating film 2 is set to a range of 20 nm to 40 nm. Subsequently, the semiconductor substrate 1 is subjected to formation of various resist patterns and ion implantation. Thereby, the photodetector parts 11 and the transfer channel 12 are formed.

Next, the transfer electrodes 3c, 3d are formed. Unlike Embodiment 1, the transfer electrodes are formed to include the low-resistance material 8 such as cobalt silicide, titanium silicide, tungsten silicide and the like. In the manufacturing step, any generally-known processes can be used. For example, in a case of forming the cobalt silicide, a film of cobalt is formed to cover the whole upper surface of the semiconductor substrate 1 including the transfer electrodes 3c, 3d made of a polysilicon film, then the polysilicon and the cobalt are annealed to react each other for forming silicide. Next, the residual cobalt is eliminated.

Subsequently, similarly to the process as shown in FIGS. 4A-4C in Embodiment 1, an insulating film 4 is formed.

Next, similarly to the process of Embodiment 1 as shown in FIGS. 5A-5C, contacts 16 are formed on the second transfer electrodes 3d. Further, an electrically conductive film 17 for covering the whole upper surface of the semiconductor substrate 1 including the transfer electrodes 3c, 3d are formed. The electrically conductive film 17 (first light-shielding film 5a) is in a state electrically connected to the second transfer electrodes 3d by the contacts 16.

Later, similarly to the process as shown in FIGS. 6A-6C, etching by a photolithographic method is carried out, thereby the first light-shielding film 5a is formed.

Figure 11A:
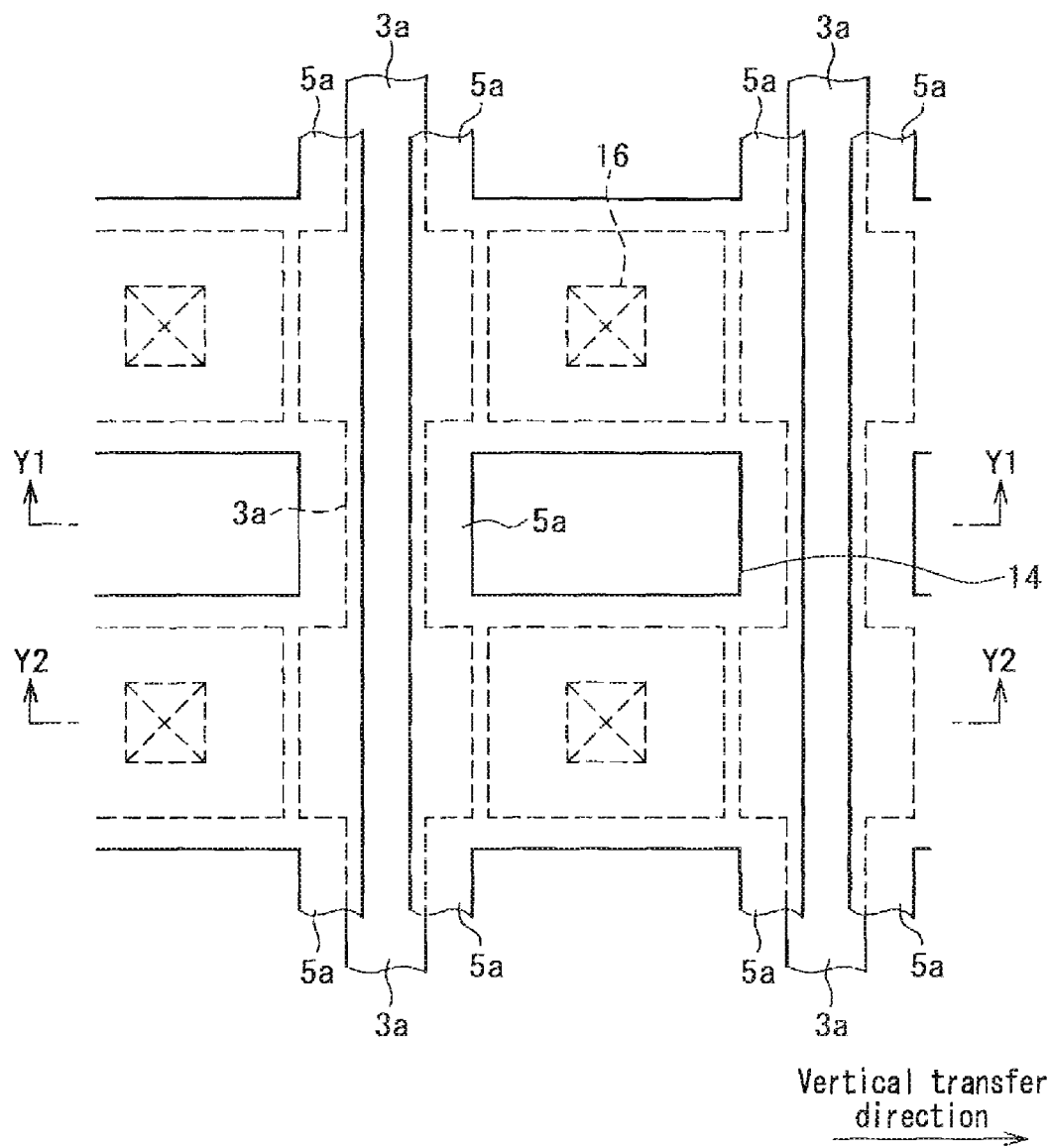
FIG. 11A is a plan view showing a method of manufacturing a solid state imaging device according to Embodiment 2 of the present invention.
Figure 11B:
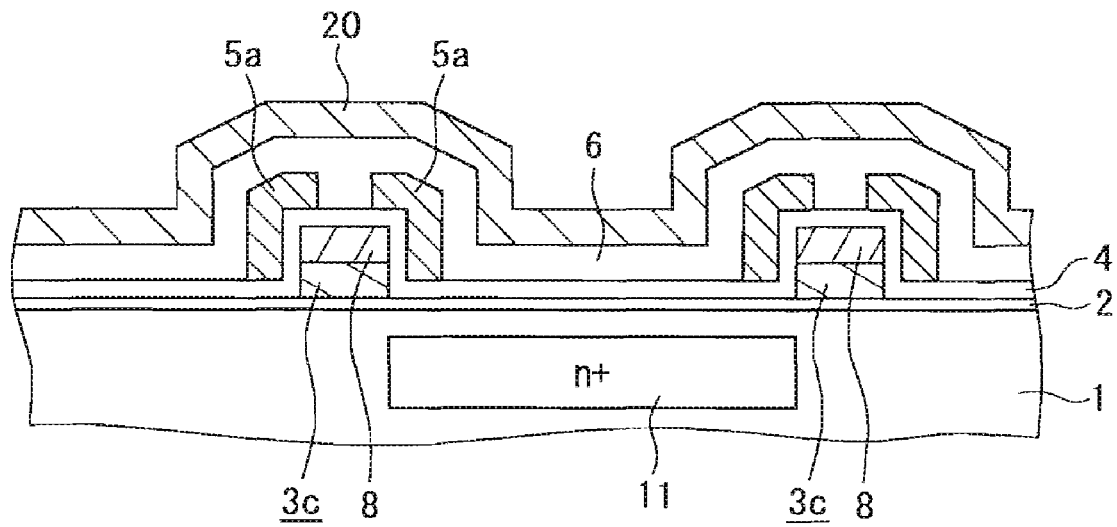
FIG. 11B is a cross sectional view taken along a line Y1-Y1 in FIG. 11A.
Figure 11C:
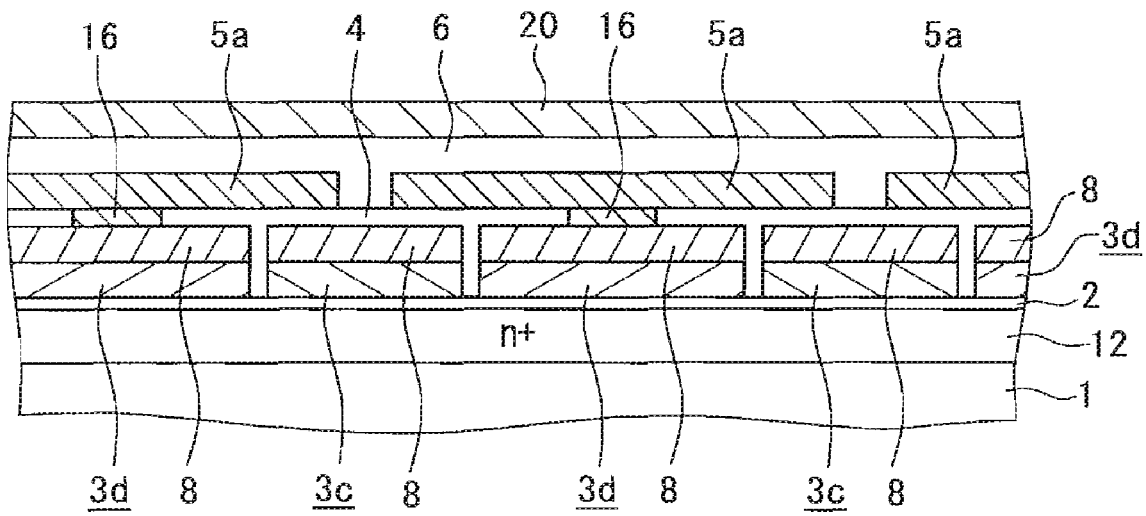
FIG. 11C is a cross sectional view taken along a line Y2-Y2 in FIG. 11A.

Next, as shown in FIG. 11C, unlike Embodiment 1, an insulating film 6 is formed to cover the whole upper surface of the semiconductor substrate 1 including the first light-shielding film 5a and the transfer electrodes 3c, 3d, without forming any contacts on the first transfer electrodes 3c. Further, a film of a light-shielding material 20 is formed to cover the whole upper surface of the semiconductor substrate 1 including the transfer electrodes 3c, 3d. It should be noted that the light-shielding material 20 is not shown in FIG. 11A for the simplicity of the drawing.

Subsequently, the light-shielding material 20 is etched by using the photolithographic method so as to form a second light-shielding film 7a (see FIGS. 10A-10C). At this time, similarly to Embodiment 1, the photoresist pattern is formed so that the side edge of the thus obtained second light-shielding film 7a is positioned between the side edge of the first light-shielding film 5a in the region where the first light-shielding film 5a is isolated and a side edge of the first light-shielding film 5a at the side of the photodetector part 11. Alternatively, the side edge of the second light-shielding film 7a can be aligned with the side edge of the first light-shielding film 5a. Further, at this time, the position of the edge of the resist pattern is adjusted in view of the amount of the dimensional shift caused by the etching.

Later, as needed, insulating films such as a BPSG (Boron Phosphorous Silicate Glass) film, a lens element or the like are formed (not shown).

As described above, as a result of carrying out the steps as shown in FIGS. 11A-11C, the solid state imaging device as shown in FIGS. 10A-10C is obtained. Similarly to Embodiment 1, with this solid state imaging device, high speed picture-taking can be carried out at a high sensitivity and with reduced smearing.

Embodiment 3

Figure 12A:
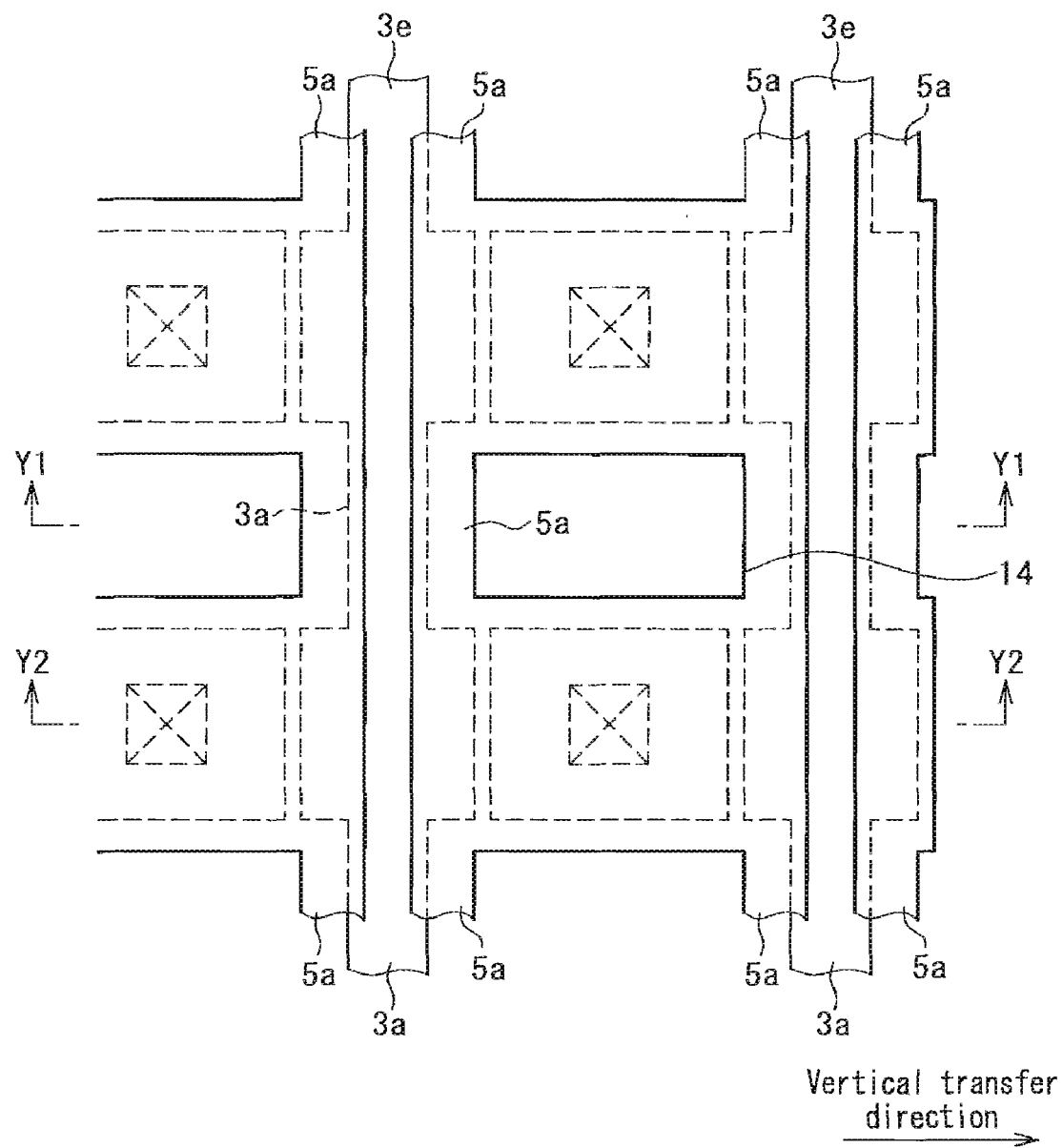
FIG. 12A is a plan view showing a configuration of a solid state imaging device according to Embodiment 3 of the present invention.
Figure 12B:
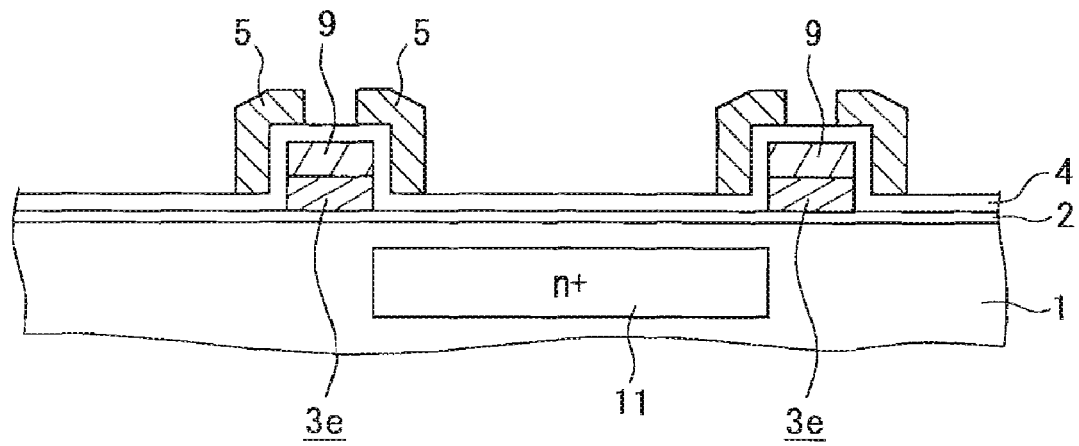
FIG. 12B is a cross sectional view taken along a line Y1-Y1 in FIG. 12A.
Figure 12C:
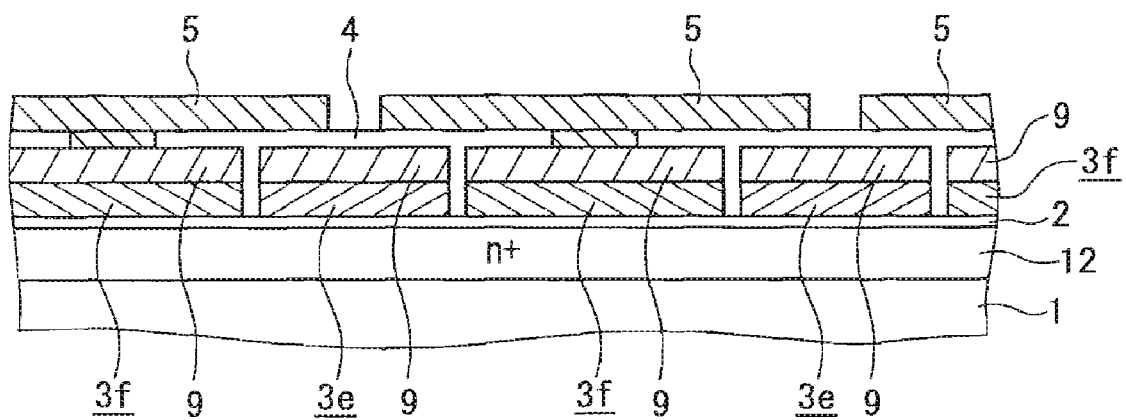
FIG. 12C is a cross sectional view taken along a line Y2-Y2 in FIG. 12A.
Figure 13:
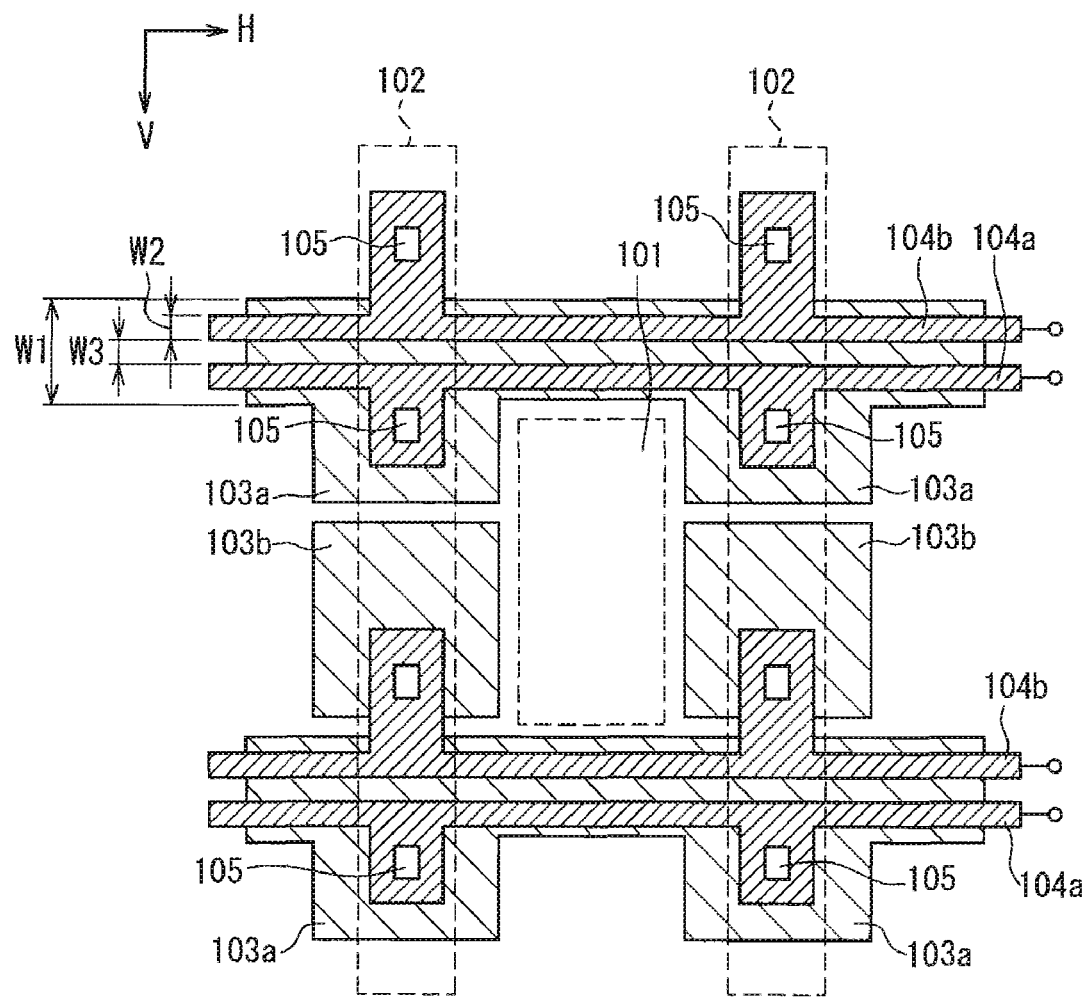
FIG. 13 is a plan view of a conventional solid state imaging device.

A solid state imaging device and a method of manufacturing the same according to Embodiment 3 of the present invention will be described below with reference to FIGS. 12A-12C. FIG. 12A is a magnified plan view showing a portion of the solid state imaging device in Embodiment 3, FIG. 12B is a cross-sectional view thereof taken along a line Y1-Y1, and FIG. 12C is a cross-sectional view thereof taken along a line Y2-Y2. Components common to those shown in FIGS. 10A-10C are assigned with the identical reference numerals in order to avoid repetition of explanation.

First, the configuration of the solid state imaging device according to the present embodiment will be described. As shown in FIGS. 12B and 12C, the solid state imaging device according to the present embodiment also is a CCD type solid state imaging device having a shunt wiring structure similar to the solid state imaging devices according to Embodiments 1 and 2. Similarly in the present embodiment, a lattice-like first light-shielding film provided on the upper layer of the vertical charge transfer parts shields optically the vertical charge transfer parts and at the same time functions as a shunt wiring for applying a transfer pulse to the second transfer electrodes.

The solid state imaging device according to the present embodiment is different from the solid state imaging device according to Embodiment 2 as shown in FIGS. 10A-10C in the configurations of the transfer electrodes and the light-shielding films. The differences will be specified below.

As shown in FIGS. 12B and 12C, the transfer electrodes 3e, 3f according to the present embodiment include a light-shielding low-resistance material 9 on at least the upper surface of the transfer electrodes, and the light-shielding low-resistance material 9 has a resistance lower than that of a polysilicon film and that shields light, unlike the transfer electrodes 3c, 3d as shown in FIGS. 10B and 10C. Specific examples for the light-shielding low-resistance material 9 include tungsten and the like.

The light-shielding low-resistance material 9 is not necessarily included in both the first transfer electrode 3e and the second transfer electrode 3f, as long as the light-shielding low-resistance material 9 is included in at least the first transfer electrode 3e.

Further, unlike Embodiments 1 and 2, a second light-shielding film is not formed in the present embodiment as shown in FIGS. 12A-12C. Therefore, the distance between a lens element to be formed thereon and the semiconductor substrate 1 is small in comparison with Embodiments 1 and 2.

Although no second light-shielding film 7 is formed, since the first transfer electrode 3a itself has a light-shielding property, leakage of obliquely entering light from the isolation region of the first light-shielding film 5 to the vertical charge transfer parts 13 can be suppressed sufficiently as in Embodiment 1.

For the first light-shielding film 5a, the isolation width can be fixed to about 0.3 μm for example, similarly to Embodiment 2.

As described above, since the first transfer electrode 3e itself includes the light-shielding low-resistance material 9, the solid state imaging device is superior to a conventional solid state imaging device in that the speed of the transfer frequency can be enhanced as in Embodiments 1 and 2.

Further, since the isolation width of the first light-shielding film 5a can be set to be sufficiently small in any regions, the effect of suppressing leakage of oblique light into the vertical charge transfer parts 13 can be obtained sufficiently.

Moreover, since the distance between the lens element and the semiconductor substrate 1 can be decreased, the sensitivity can be improved and the smearing can be reduced further.

Furthermore, since the step of forming the second light-shielding film becomes unnecessary, the term for manufacturing can be shortened further and the yield can be improved.

The method of manufacturing a solid state imaging device according to the present embodiment is distinguished from the method of manufacturing a solid state imaging device according to Embodiment 2 in only that the light-shielding low-resistance material 9 is arranged at least on the upper face of the first transfer electrodes 3e and that the step of forming the second light-shielding film is omitted. The other steps can be carried out as in Embodiment 2.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid state imaging device comprising:
a plurality of photodetector parts that are arranged in matrix on a semiconductor substrate and that convert incident light into signal charge,
a plurality of vertical charge transfer parts that read out the signal charge from the photodetector parts and transfer the signal charge in the vertical direction, and
a first light-shielding film that shields the plural vertical charge transfer parts from the incident light;
wherein each of the plural vertical charge transfer parts comprises: a transfer channel provided on the semiconductor substrate along the vertical array of the plural photodetector parts, a plurality of first transfer electrodes that are provided on the transfer channel so as to traverse the transfer channel and that are coupled to each other in the horizontal direction in spacing between the photodetector parts, and a second transfer electrode that is provided at least on the transfer channel and arranged between the first transfer electrodes; and
the first light-shielding films having electroconductivity are formed continuously in the horizontal direction, with openings on the photodetector parts and isolation regions formed between the photodetector parts so as to extend in the horizontal direction, the first light-shielding films being connected electrically to the second transfer electrode.

2. The solid state imaging device according to claim 1, wherein the isolation regions of the first light-shielding film are formed on the first transfer electrodes.

3. The solid state imaging device according to claim 1, comprising a second light-shielding film that passes between the photodetector parts adjacent to each other in the vertical direction and that covers the isolation regions of the first light-shielding film and traverses the transfer channels, the second light-shielding film having electroconductivity and being connected electrically to the first transfer electrodes.

4. The solid state imaging device according to claim 3, wherein connection parts between the first transfer electrodes and the second light-shielding film are provided on electrodes in a region outside the vertical charge transfer parts.

5. The solid state imaging device according to claim 3, wherein the second light-shielding film is arranged above the first light-shielding film.

6. The solid state imaging device according to claim 3, wherein the second light-shielding film is formed so that the side edge is positioned between the side edge of the first light-shielding film facing the isolation region and the side edge of the first light-shielding film at the photodetector part side.

7. The solid state imaging device according to claim 1, wherein the second transfer electrodes comprise a material having a low resistance in comparison with polysilicon.

8. The solid state imaging device according to claim 7, wherein the second light-shielding film comprises at least on the upper surface a light-shielding metallic material that has a low resistance in comparison with the polysilicon.

9. A method of manufacturing a solid state imaging device comprising: a plurality of photodetector parts that are arranged in matrix and that convert incident light into signal charge, a plurality of vertical charge transfer parts that read out the signal charge from the photodetector parts and transfer the signal charge in the vertical direction, and a light-shielding film that shields the plural vertical charge transfer parts from the incident light, the method comprising steps of:
(a) forming on a semiconductor substrate the plural photodetector parts and transfer channels each arranged along the vertical array of the plural photodetector parts;
(b) forming the plural vertical charge transfer parts by providing on the transfer channel a plurality of first transfer electrodes that traverse the transfer channel and are coupled in the horizontal direction in spacing between the photodetector parts, and second transfer electrodes that are provided at least on the transfer channel and between the first transfer electrodes;

(c) forming a first interlayer insulating film that covers the plural transfer electrodes;
(d) forming on the first interlayer insulating film an electrically conductive film that covers the first interlayer insulating film and that is connected electrically to the second transfer electrodes; and
(e) forming a light-shielding film by processing the electrically conductive film to form openings on the photodetector parts and form isolation regions between the photodetector parts, the isolation regions extending in the horizontal direction with respect to the first transfer electrodes.

10. The method of manufacturing a solid state imaging device according to claim 9, wherein in step (e), the step of forming the openings and the step of forming the isolation regions are carried out respectively as separate steps.

* * * * *